(12) United States Patent
Winter et al.

(10) Patent No.: US 7,362,114 B2
(45) Date of Patent: Apr. 22, 2008

(54) APPARATUS FOR INTERFACING ELECTRONIC PACKAGES AND TEST EQUIPMENT

(75) Inventors: John M. Winter, Wrentham, MA (US); Larre H. Nelson, Attleboro, MA (US); John C. Bergeron, Attleboro, MA (US); Lourie M. Sarcione, Attleboro, MA (US)

(73) Assignee: Rika Electronics International, Inc., Attleboro, MA (US)

( * ) Notice: Subject to any disclaimer, the term of this patent is extended or adjusted under 35 U.S.C. 154(b) by 582 days.

(21) Appl. No.: 10/974,147

(22) Filed: Oct. 27, 2004

(65) Prior Publication Data

US 2005/0146341 A1 Jul. 7, 2005

(51) Int. Cl.
*G01R 31/02* (2006.01)

(52) U.S. Cl. .................................. 324/755; 324/754

(58) Field of Classification Search ............. None
See application file for complete search history.

(56) References Cited

U.S. PATENT DOCUMENTS

| | | | |
|---|---|---|---|
| 3,416,125 A | 12/1968 | Theve | |
| 3,435,168 A | 3/1969 | Cooney | |
| 3,654,583 A | 4/1972 | Mancini | |
| 3,777,303 A | 12/1973 | McDonough | |
| 3,902,153 A | 8/1975 | Narozny | |
| 4,105,970 A | 8/1978 | Katz | |
| 4,132,948 A | 1/1979 | Katz | |
| 4,164,704 A | 8/1979 | Kato et al. | |
| 4,175,810 A | 11/1979 | Holt et al. | |
| 4,307,928 A | 12/1981 | Petlock, Jr. | |
| 4,397,519 A | 8/1983 | Cooney | |
| 4,438,397 A | 3/1984 | Katz | |
| 4,443,756 A | 4/1984 | Lightbody et al. | |
| 4,508,405 A | 4/1985 | Damon et al. | |
| 4,544,888 A | 10/1985 | Kvaternik | |
| 4,551,675 A | 11/1985 | Heys et al. | |
| 4,560,926 A | 12/1985 | Cornu et al. | |
| 4,597,622 A | 7/1986 | Coe | |
| 4,620,761 A | 11/1986 | Smith et al. | |
| 4,653,839 A | 3/1987 | Powell | |
| 4,659,987 A | 4/1987 | Coe et al. | |
| 4,686,465 A | 8/1987 | Kruger | |
| RE32,540 E | 11/1987 | Murphy | |
| 4,724,383 A | 2/1988 | Hart | |
| 4,734,046 A | 3/1988 | McAllister et al. | |
| 4,739,259 A | 4/1988 | Hadwin et al. | |
| 4,740,746 A | 4/1988 | Pollock et al. | |
| 4,758,780 A | 7/1988 | Coon et al. | |

(Continued)

FOREIGN PATENT DOCUMENTS

DE 101 07 794 A1 2/2001

(Continued)

OTHER PUBLICATIONS

AQL Manufacturing, "AQL Interconnects: AQL TestSockets: Replacement Cable Connectors . . . ," (Aug. 18, 2002).

*Primary Examiner*—Paresh Patel
(74) *Attorney, Agent, or Firm*—Cantor Colburn LLP

(57) ABSTRACT

A test apparatus for testing electrical devices such as ICs is provided. The test apparatus includes a test socket mounted on a DUT board in which a contact plunger assembly is at least partially positioned.

17 Claims, 19 Drawing Sheets

U.S. PATENT DOCUMENTS

| | | | |
|---|---|---|---|
| 4,782,289 A | 11/1988 | Schwar et al. |
| 4,797,113 A | 1/1989 | Lambert |
| 4,885,533 A | 12/1989 | Coe |
| 4,897,043 A | 1/1990 | Giringer et al. |
| 4,904,213 A | 2/1990 | Hock et al. |
| 4,913,286 A | 4/1990 | Tate |
| 4,993,136 A | 2/1991 | Kerschner et al. |
| 5,014,004 A | 5/1991 | Kreibich et al. |
| 5,045,780 A | 9/1991 | Swart |
| 5,066,909 A | 11/1991 | Firooz |
| 5,151,040 A | 9/1992 | Tanaka |
| 5,154,621 A | 10/1992 | Legrady |
| 5,159,265 A | 10/1992 | Alfonso et al. |
| 5,174,763 A | 12/1992 | Wilson |
| 5,175,493 A | 12/1992 | Langgard |
| 5,200,695 A | 4/1993 | Kazama |
| 5,225,773 A | 7/1993 | Richards |
| 5,227,718 A | 7/1993 | Stowers et al. |
| 5,330,448 A | 7/1994 | Chu |
| 5,384,531 A | 1/1995 | Yamazaki et al. |
| 5,410,260 A | 4/1995 | Kazama |
| 5,414,369 A | 5/1995 | Kazama |
| 5,447,442 A | 9/1995 | Swart |
| 5,461,326 A | 10/1995 | Woith et al. |
| 5,463,325 A | 10/1995 | Fujii |
| 5,484,306 A | 1/1996 | Mawby et al. |
| 5,485,096 A | 1/1996 | Aksu |
| 5,489,854 A | 2/1996 | Buck et al. |
| 5,500,605 A | 3/1996 | Chang |
| 5,502,397 A | 3/1996 | Buchanan |
| 5,509,814 A | 4/1996 | Mosquera |
| 5,518,410 A | 5/1996 | Masami |
| 5,524,466 A | 6/1996 | Coe |
| 5,534,787 A | 7/1996 | Levy |
| 5,559,444 A | 9/1996 | Farnworth et al. |
| 5,561,594 A | 10/1996 | Wakefield |
| 5,588,847 A | 12/1996 | Tate |
| 5,609,489 A | 3/1997 | Bickford et al. |
| 5,611,696 A | 3/1997 | Donner et al. |
| 5,625,166 A | 4/1997 | Nataraian |
| 5,641,315 A | 6/1997 | Swart et al. |
| D385,889 S | 11/1997 | Kullas et al. |
| 5,688,127 A | 11/1997 | Staab et al. |
| 5,713,744 A | 2/1998 | Laub |
| 5,727,954 A | 3/1998 | Kato et al. |
| 5,742,481 A | 4/1998 | Murphy et al. |
| 5,766,021 A | 6/1998 | Pickles et al. |
| 5,781,023 A | 7/1998 | Swart et al. |
| 5,791,914 A | 8/1998 | Loranger et al. |
| 5,801,544 A | 9/1998 | Swart et al. |
| 5,865,632 A | 2/1999 | Iwasaki |
| 5,877,554 A | 3/1999 | Murphy |
| 5,896,037 A | 4/1999 | Kudla et al. |
| 5,908,324 A | 6/1999 | Ohshima et al. |
| 5,917,703 A | 6/1999 | Murphy |
| 5,936,421 A | 8/1999 | Stowers et al. |
| 5,942,906 A | 8/1999 | Stowers et al. |
| 5,967,848 A | 10/1999 | Johnson et al. |
| 5,990,697 A | 11/1999 | Kazama |
| 6,020,635 A | 2/2000 | Murphy |
| 6,028,437 A | 2/2000 | Potter |
| 6,043,666 A | 3/2000 | Kazama |
| 6,046,597 A | 4/2000 | Barabi |
| 6,053,777 A | 4/2000 | Boyle |
| 6,084,421 A | 7/2000 | Swart et al. |
| 6,097,609 A | 8/2000 | Kabadi |
| 6,104,205 A | 8/2000 | Mawby |
| 6,127,835 A | 10/2000 | Kocher et al. |
| 6,152,744 A | 11/2000 | Maeda |
| 6,159,056 A | 12/2000 | Boyle |
| 6,175,243 B1 | 1/2001 | Kocher et al. |
| 6,181,149 B1 | 1/2001 | Godfrey et al. |
| 6,190,181 B1 | 2/2001 | Affolter et al. |
| 6,193,524 B1 | 2/2001 | Chang |
| 6,204,680 B1 | 3/2001 | Swart et al. |
| 6,208,155 B1 | 3/2001 | Barabi et al. |
| 6,208,158 B1 | 3/2001 | Schein et al. |
| 6,213,787 B1 | 4/2001 | Murphy |
| 6,229,322 B1 | 5/2001 | Hembree |
| 6,249,440 B1 | 6/2001 | Affolter |
| 6,256,202 B1 | 7/2001 | Murphy |
| 6,267,603 B1 | 7/2001 | Yamamoto et al. |
| 6,271,672 B1 | 8/2001 | Swart et al. |
| 6,275,054 B1 | 8/2001 | Boyle |
| 6,292,004 B1 | 9/2001 | Kocher |
| 6,299,459 B1 | 10/2001 | Botka et al. |
| 6,313,530 B1 | 11/2001 | Murphy |
| 6,323,667 B1 | 11/2001 | Kazama |
| 6,338,629 B1 | 1/2002 | Fisher et al. |
| 6,341,962 B1 | 1/2002 | Sinclair |
| 6,341,963 B1 | 1/2002 | Hussain |
| 6,344,684 B1 | 2/2002 | Hussain et al. |
| 6,352,437 B1 | 3/2002 | Tate |
| 6,359,452 B1 | 3/2002 | Mozzetta |
| 6,377,059 B2 | 4/2002 | Vinther et al. |
| 6,396,293 B1 | 5/2002 | Vinther et al. |
| 6,462,567 B1 | 10/2002 | Vinther et al. |
| 6,464,511 B1 | 10/2002 | Watanabe et al. |
| 6,512,389 B1 | 1/2003 | Kocher |
| 6,533,595 B2 | 3/2003 | Yamada |
| 6,570,399 B2 | 5/2003 | Yeghiayan et al. |
| 6,652,326 B2 | 11/2003 | Boyle et al. |
| 6,667,629 B2 | 12/2003 | Souza et al. |
| 6,696,850 B1 | 2/2004 | Sanders |
| 6,743,043 B2 | 6/2004 | Yamada |
| 2002/0132514 A1 | 9/2002 | Feldman |
| 2004/0140821 A1 | 7/2004 | Lee |

FOREIGN PATENT DOCUMENTS

| | | |
|---|---|---|
| EP | 0 829 188 | 8/1999 |
| WO | WO 00/04395 | 7/1999 |

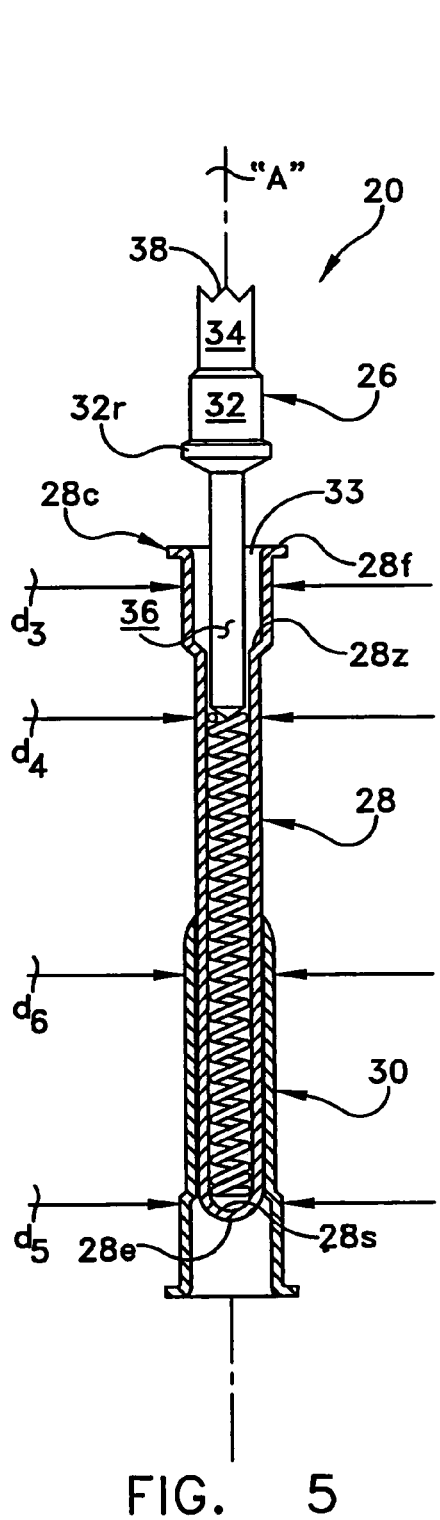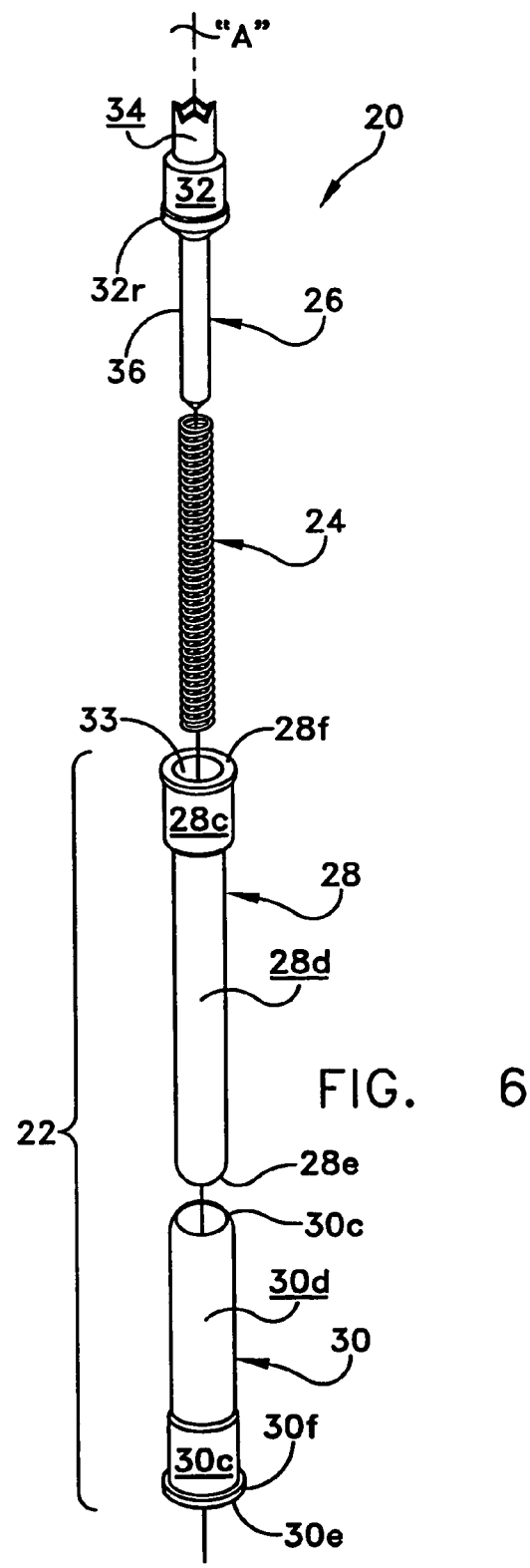
FIG. 5
FIG. 6

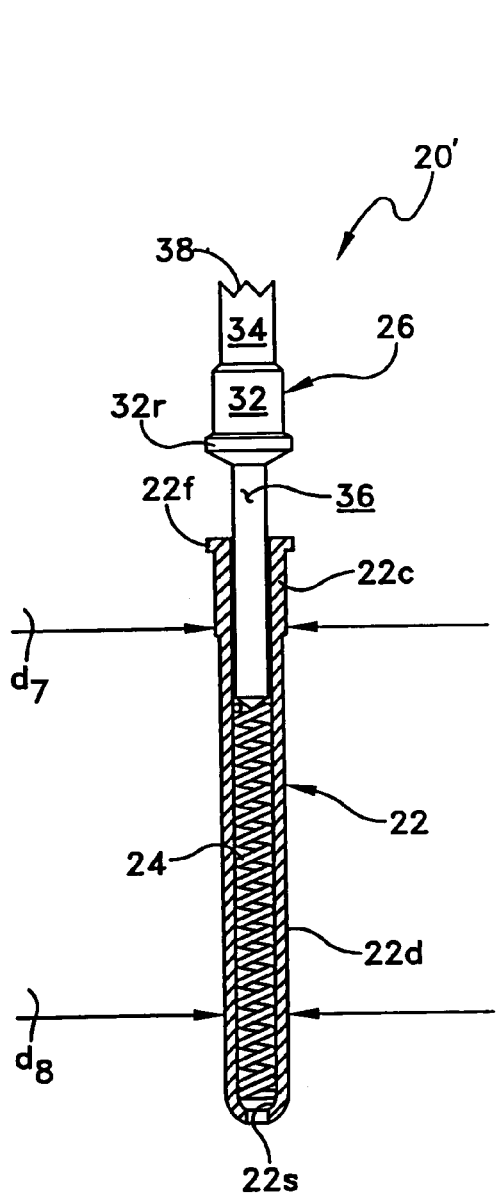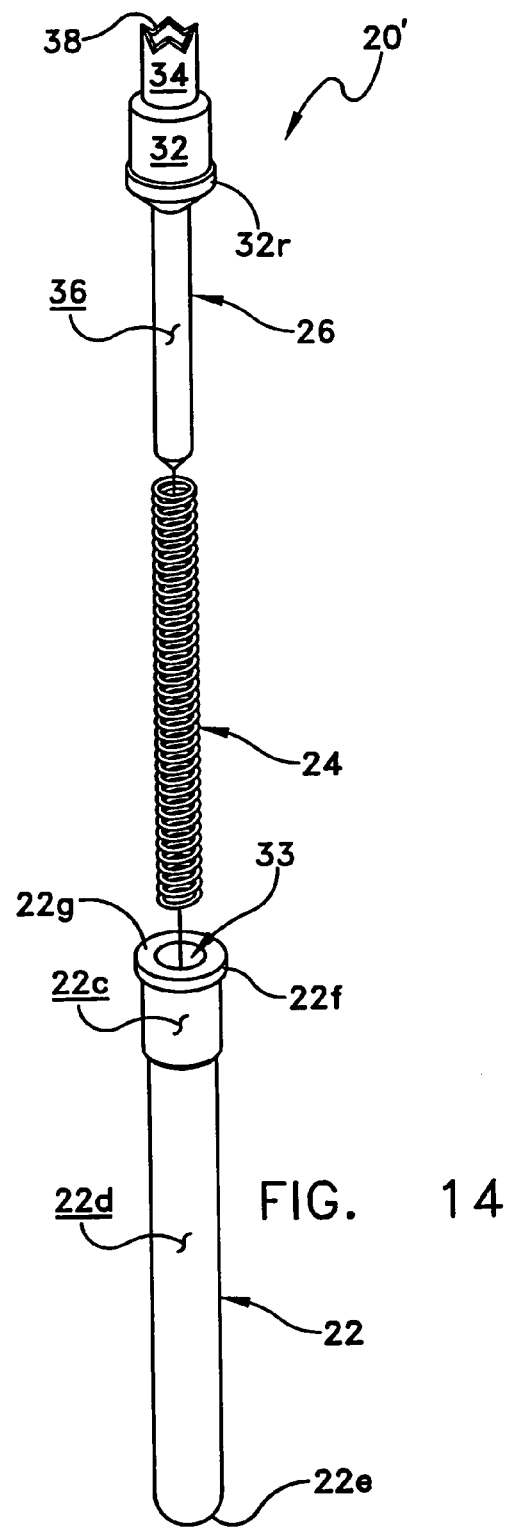
FIG. 13
FIG. 14

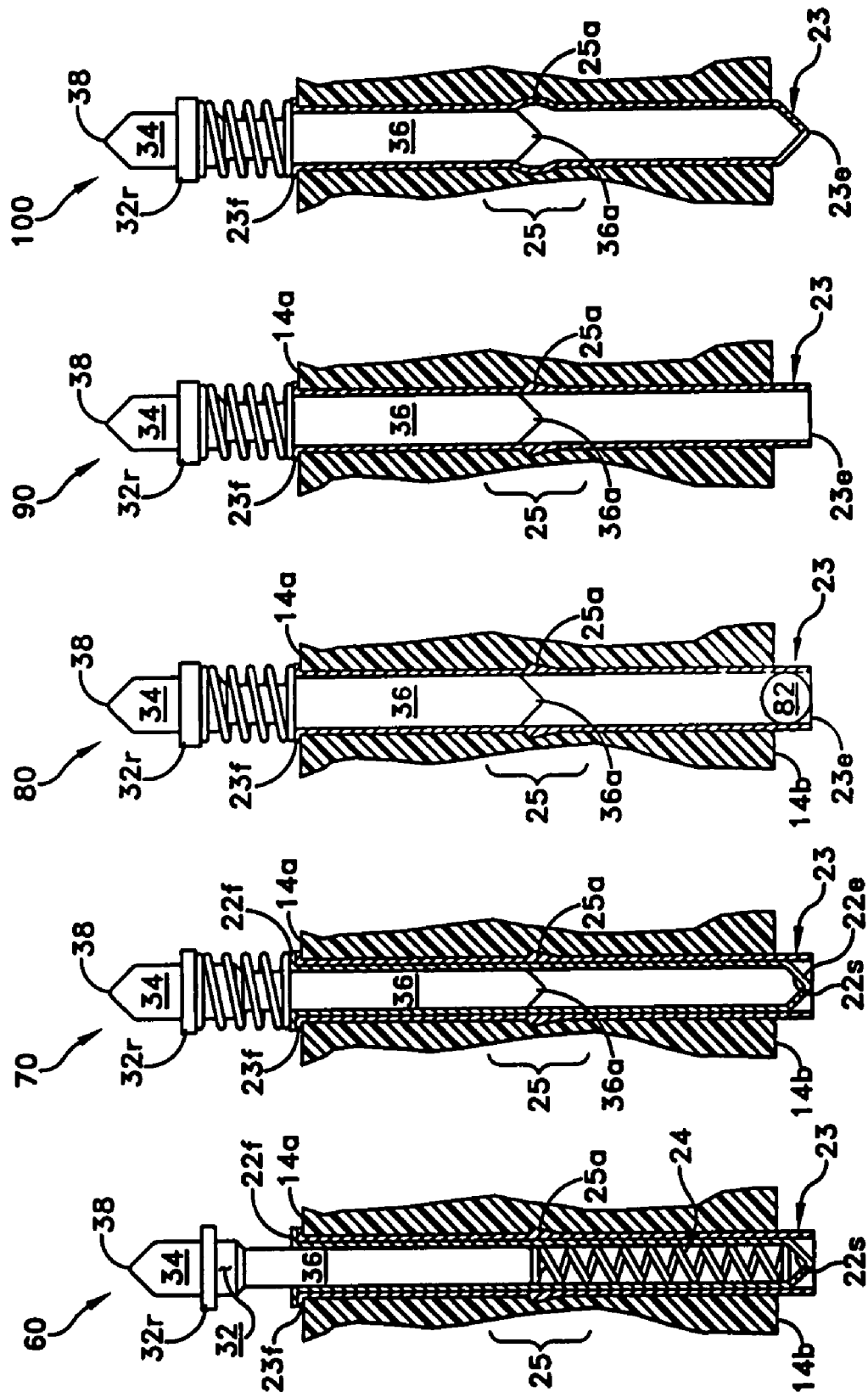

APPARATUS FOR INTERFACING ELECTRONIC PACKAGES AND TEST EQUIPMENT

BACKGROUND

1. Technical Field

This disclosure relates generally to equipment used in testing electronic packages, such as integrated circuits, and more particularly to an apparatus for interfacing electronic packages and test equipment.

2. Related Applications

Priority is hereby claimed under 35 U.S.C. § 119(e) to co-pending and commonly-owned U.S. Provisional Patent Application No. 60/361,882, which was filed on Mar. 5, 2002, and U.S. Provisional Patent Application No. 60/410,121, which was filed on Sep. 13, 2002, each of which is incorporated herein by reference in its entirety.

3. Related Art

Typically, integrated circuit (IC) packages (devices under test) are removably mounted in sockets which in turn are mounted on a circuit substrate, commonly referred to as a device-under-test or DUT board. The sockets mount individual contacts for electrically connecting each terminal of a device to be tested to an individual circuit path on the DUT board. The DUT board is in turn electrically connected to computerized test equipment. This arrangement facilitates testing providing top loading and unloading and is readily adapted for use with different ICs; however, it does have certain limitations. One such limitation relates to the height required for the interface equipment, i.e., the sockets. The distance between the terminals of the device under test and the location of interconnection with the respective circuit paths on the DUT board is an important parameter, maximizing the fidelity of the electrical signal passing therethrough. The fidelity of the electrical signal is subject to compromise in that distance having largely uncontrolled impedance and high cross talk.

U.S. Pat. No. 6,512,389 to Kocher discloses an apparatus for passing test signals between a mother board and a daughter board, in which spring test probes are positioned in bores in the mother board.

A need exists in the art for improved methods and devices for improving the fidelity of electrical signals passing from test equipment to a device under test.

SUMMARY

The present disclosure is directed to an apparatus for interfacing electronic packages and test equipment for the packages. The apparatus includes a printed circuit board having first and second opposing surfaces. A plurality of vias may be formed in the printed circuit board in a predetermined pattern, each via having upper and lower ends and an inner diameter. The apparatus also includes a test socket overlaying the first surface of the printed circuit board, the test socket including a first plate and a second plate overlaying the first plate. Each of the first and second plates includes a plurality of bores corresponding to the vias in the printed circuit board. The apparatus also includes a conductive sleeve member positioned in each via. The sleeve member has an upper end and a lower end. The apparatus also includes a biasing member seated against the lower end of the conductive sleeve member. The biasing member has an outer diameter less than an inner diameter of the conductive sleeve member and is moveable in the conductive sleeve member. The apparatus also includes a plunger having a substantially cylindrical body which includes an outwardly extending annular flange. The plunger further includes a first rod portion extending upwardly from the body and a second rod portion depending downwardly from the body. The first rod portion includes an upper surface defining a selected contact portion, and may be at least partially received in the conductive sleeve member adjacent the biasing member. The body may be received in the bores of the second plate. The upper rod portion may be at least partially received in the bores of the first plate. When the apparatus is in an operating position, the plunger is urged upwardly to make electrical contact with a package terminal.

In another embodiment, the apparatus includes a printed circuit board having first and second opposing surfaces. A plurality of vias may be formed in the printed circuit board in a predetermined pattern, each via having upper and lower ends and an inner diameter. The apparatus also includes a test socket overlaying the first surface of the printed circuit board, the test socket including a first plate and a second plate overlaying the first plate. Each of the first and second plates includes a plurality of bores corresponding to the vias in the printed circuit board. The apparatus also includes a conductive sleeve member positioned in each via. The sleeve member has an upper end and a lower end. The apparatus also includes a plunger having a substantially cylindrical rod shape with an annular flange extending outwardly therefrom. A first rod portion extends upwardly from the annular flange and a second rod portion depends downwardly from the annular flange. The first rod portion includes an upper surface defining a selected contact region. In the present embodiment, a biasing member may be positioned about the second rod portion and seated against the upper surface of the printed circuit board and the lower surface of the annular flange. When the apparatus is in an operating position, the first rod portion is at least partially received in the bores of the first plate, the annular flange is received in the bores of the second plate, and the second rod portion is at least partially received in the conductive sleeve member, and the plunger is urged upwardly to make electrical contact with a package terminal.

The foregoing and other objects, features and advantages of the disclosure will be apparent from the following more particular description of preferred embodiments of the disclosure, as illustrated in the accompanying drawings in which like reference characters refer to the same parts throughout the different views. The drawings are not necessarily to scale, emphasis instead being placed upon illustrating the principles of the disclosure. The principles and features of this disclosure may be employed in varied and numerous embodiments without departing from the scope of the disclosure.

BRIEF DESCRIPTION OF THE DRAWINGS

It should be understood that the drawings are provided for the purpose of illustration only and are not intended to define the limits of the disclosure. The foregoing and other objects and advantages of the embodiments described herein will become apparent with reference to the following detailed description when taken in conjunction with the accompanying drawings in which:

FIG. 5 is an expanded cross sectional view of a single contact plunger assembly shown in FIG. 3;

FIG. 6 is an exploded view of the contact plunger assembly shown in FIG. 5;

FIG. 13 is an enlarged cross sectional view of a single contact plunger assembly shown in FIGS. 9-12;

FIG. 14 is an exploded view of the contact plunger assembly shown in FIG. 13;

FIGS. 25-29 are cross sectional views of further alternate embodiments of test apparatus in accordance with the present disclosure, also in which a biasing member is external to the DUT board.

DETAILED DESCRIPTION OF THE PREFERRED EMBODIMENTS

The present disclosure is directed to an apparatus for maximizing the fidelity of an electrical signal passing from test equipment to an IC package or device under test (hereinafter (DUT), by reducing the distance between the test equipment and the terminals of the DUT. The apparatus includes a test socket for holding the DUT, which is mounted on a printed circuit board (hereinafter "DUT board") in a conventional manner. The DUT board contains a plurality of bores in which contact probe assemblies are received and which form interconnects between the test equipment and the DUT.

Figure 1:
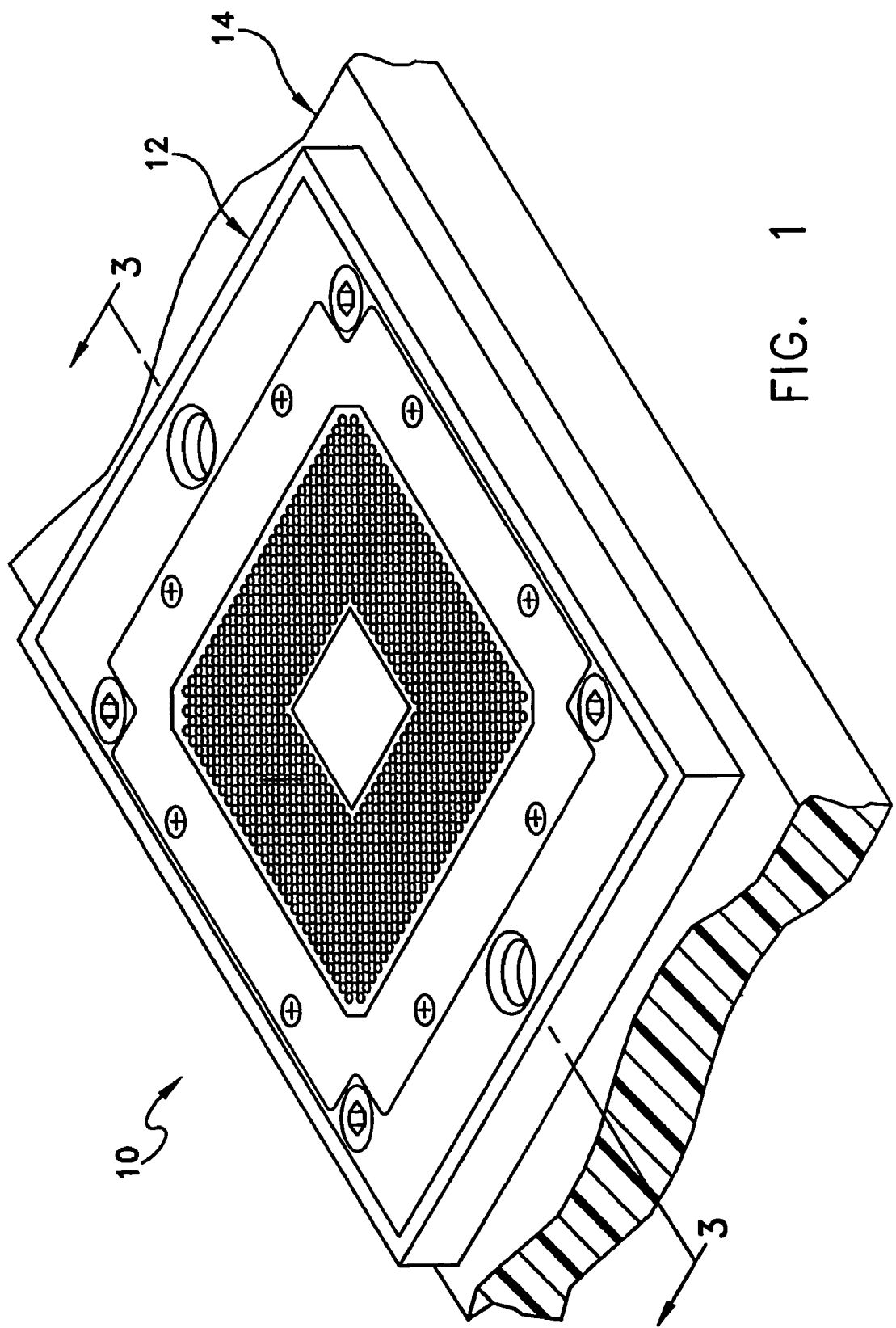
FIG. 1 is a perspective view of an IC receiving socket in accordance with the present disclosure, mounted on a DUT board, showing contact plunger assemblies positioned in the bores of the test socket and the vias of the DUT board.
Figure 2:
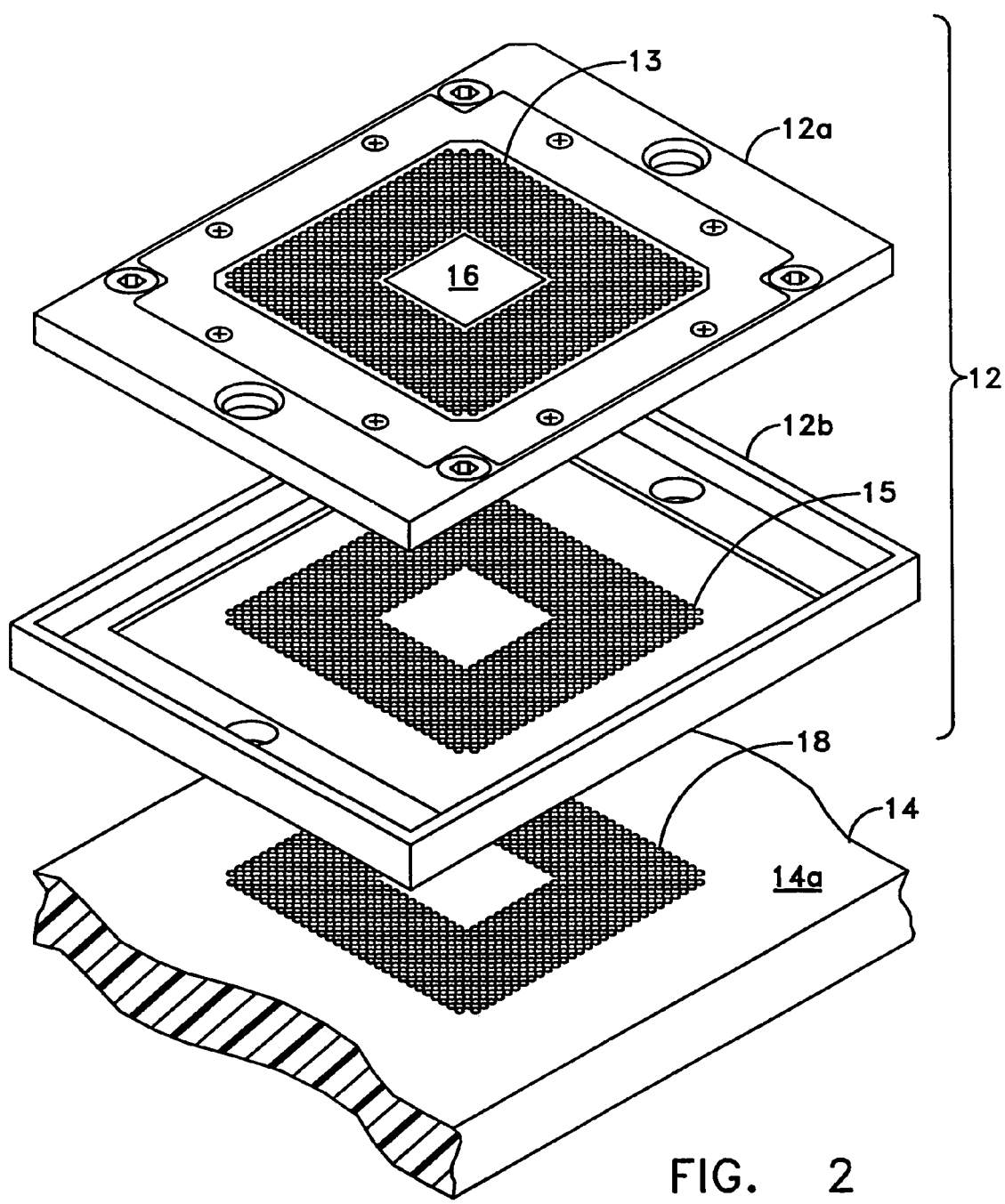
FIG. 2 is an exploded view of the IC receiving socket and DUT board shown in FIG. 1.
Figure 3:
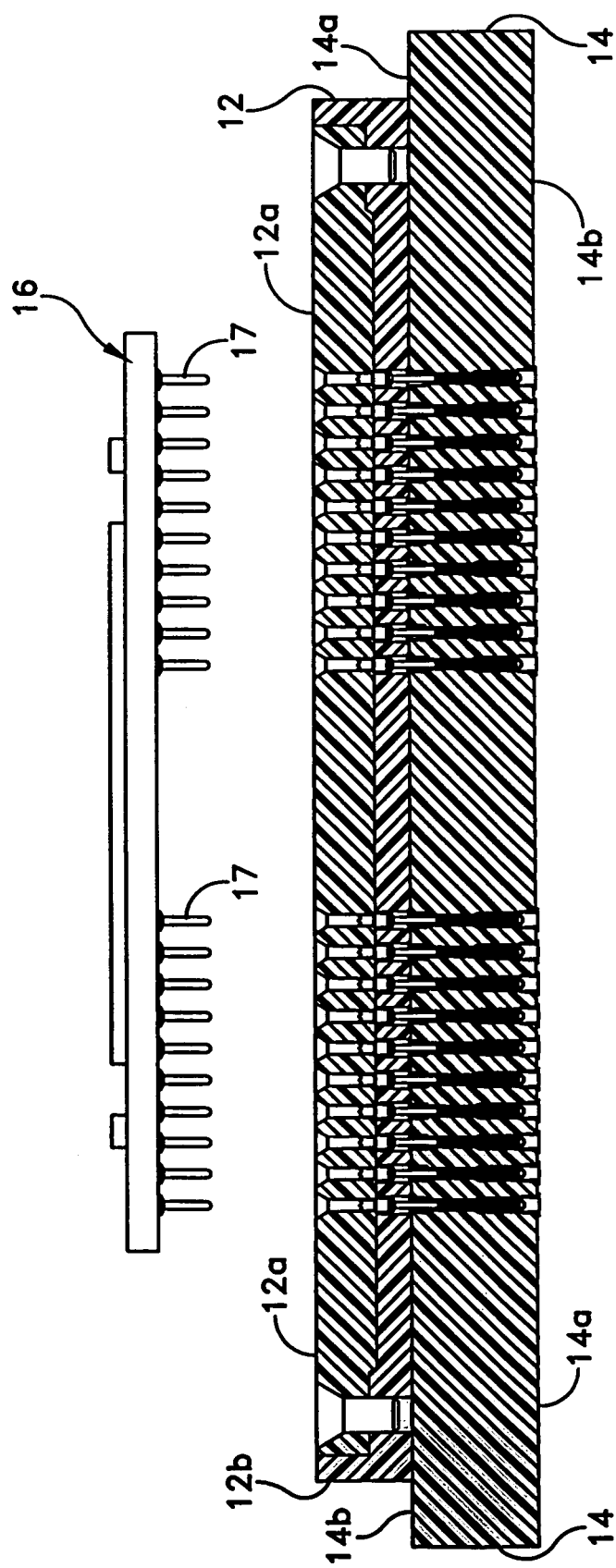
FIG. 3 is a cross sectional view of the IC receiving socket and DUT board shown in FIGS. 1-2, shown with the IC package spaced slightly above the socket, showing contact plunger assemblies extending through the bores of the test socket and the vias of the DUT board.

FIGS. 1-8, when taken together, illustrate one embodiment of an apparatus 10 according to the present disclosure. As shown in FIGS. 1-3, apparatus 10 includes test socket 12 mounted on a DUT board 14 in a conventional manner. A electronic or IC package (hereinafter package) 16, which in the present embodiment is a PGA package carrying a DUT (not illustrated), is mounted in test socket 12 in a conventional manner. Package 16 includes a predetermined pattern of terminal pins 17 corresponding to the DUT. DUT board 14 includes opposing upper and lower surfaces 14a,b and a plurality of via holes (hereinafter vias) 18 arranged in a predetermined pattern corresponding to the pattern of terminal pins of the DUT and extending from top surface 14a to bottom surface 14b. Vias 18 are generally plated with an electrically conductive material such as, for example, tin solder.

Test socket 12 includes upper and lower plates 12a,b each including corresponding patterns of bores 13,15 respectively, extending completely through each plate 12a,b, and being arranged in a predetermined pattern corresponding to the pattern of terminal pins 17 of the package 16.

Figure 4:
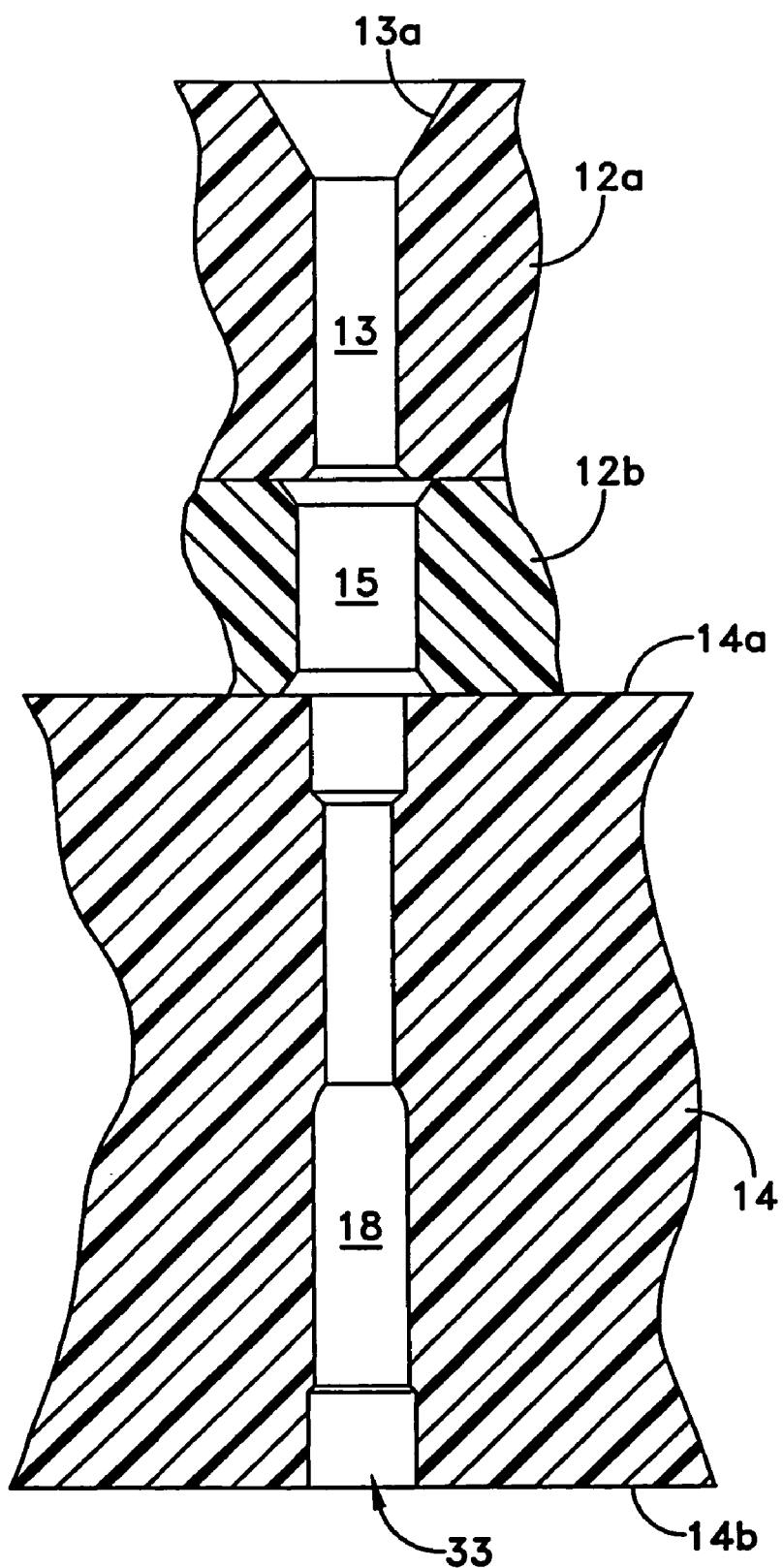
FIG. 4 is a cross sectional view of a single IC receiving socket from the DUT board shown in FIG. 3.

FIG. 4 shows a single via 18 having upper and lower ends 18a,b. In the present embodiment, each via 18 extends through DUT board 14 from upper surface 14a to lower surface 14b. In the present embodiment, each via 18 includes a shoulder 18s at each of upper and lower ends 18a,b. Vias 18 may have a constant inner diameter or one that varies, as in the present embodiment, in which each via 18 has an inner diameter $d_1$ at each end 18a,b that is greater than inner diameter $d_2$.

FIGS. 5-6 show contact plunger assembly 20 in greater detail. Each contact plunger assembly 20 includes a sleeve member 22, a biasing member 24, and a plunger 26. Biasing member 24 may be, for example, a contact force coil spring, which is preferred in the present embodiment. Biasing member 24 may be formed from any suitable electrically conductive material such as gold plated, hardened beryllium copper or steel. In the present embodiment, sleeve member 22 includes upper and lower sleeve member sections 28, 30, and an axial bore 33 extending therethrough. Upper sleeve member section 28 has upper and lower ends 28u,l and lower sleeve member section 30 has upper and lower ends 30u,l. When in an assembled configuration, sleeve member 22 preferably has an outer diameter that substantially conforms to the inner diameter of vias 18 to form an interference fit therebetween. According to the present disclosure, sleeve member 22 may be one or more pieces, and may be open or closed at the bottom end.

Upper sleeve member section 28 has a minor axial length portion 28c at upper end 28u having a first outer diameter $d_3$ selected to form an interference fit with vias 18 of DUT board 14, and a second major axial length portion 28d defined by a shoulder 28z and having a second outer diameter $d_4$ that is less than diameter $d_3$. Upper end 28u of upper sleeve member section 28 is open, whereas in the present embodiment lower end 28l of upper sleeve member section 28 is constricted or closed, thereby forming an internal spring seat 28s. Upper end 28u of upper sleeve member section 28 includes an outwardly radially extending flange 28f.

Lower sleeve member section 30 also has a minor axial length portion 30c at lower end 30l having a first diameter $d_5$ selected to form an interference fit with vias 18 of DUT board 14, and a second major axial length portion 30d having a second diameter $d_6$ that is less than diameter $d_5$. Lower end 30b of lower sleeve member section 30 includes an outwardly radially extending flange 30f.

Flanges 28f, 30f may be formed integrally with each sleeve member section 28,30 or may be a separate part received on top and bottom surfaces 14a,b of DUT board 14 and electrically connected to sleeve member 22. Preferably, sleeve member 22 or sleeve member sections 28,30 may be formed of a suitable electrically conductive material such as a copper alloy preferably plated with gold.

Still referring to FIGS. 5-6, plunger 26 has a generally longitudinal cylindrical shape and includes a body 32, and first and second rod portions 34, 36 extending from opposite ends of body 32 along a longitudinal axis "A" of plunger 26. First rod portion 34 has a diameter greater than that of second rod portion 36, and includes a selected contact configuration 38 at the upper end thereof. In the present embodiment, the selected contact configuration 38 is a four point crown, but it should be understood that any contact configuration may be used. The outer diameter of first rod portion 34 is selected to be somewhat smaller than that of body 32 for a reason to be discussed below. Second longitudinal rod portion 36 depends downwardly from body 32, and is sized to be closely and slidingly received in bore 33 of sleeve member 22 in the region of section 28d. Body 32 preferably has a circumferentially extending ring portion 32r extending radially outwardly adjacent second rod portion 36.

Figure 7:
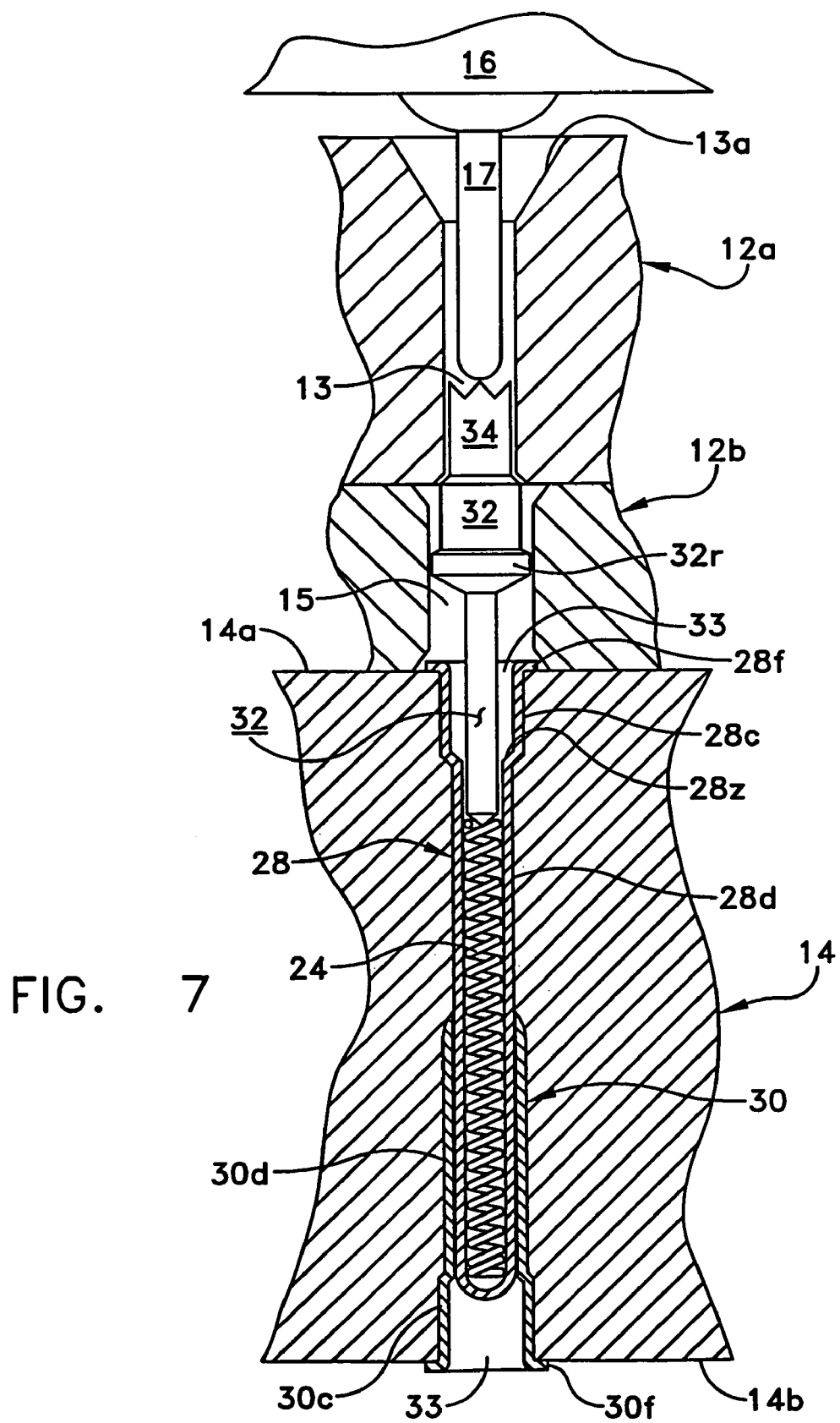
FIG. 7 is a cross sectional view of the single IC receiving socket shown in FIG. 4 with a contact plunger assembly positioned therein.

FIG. 7 shows a contact plunger assembly 20 positioned in a via 18 of DUT board 14 with the terminal 17 contacting contact 38 of plunger 26.

Figure 8:
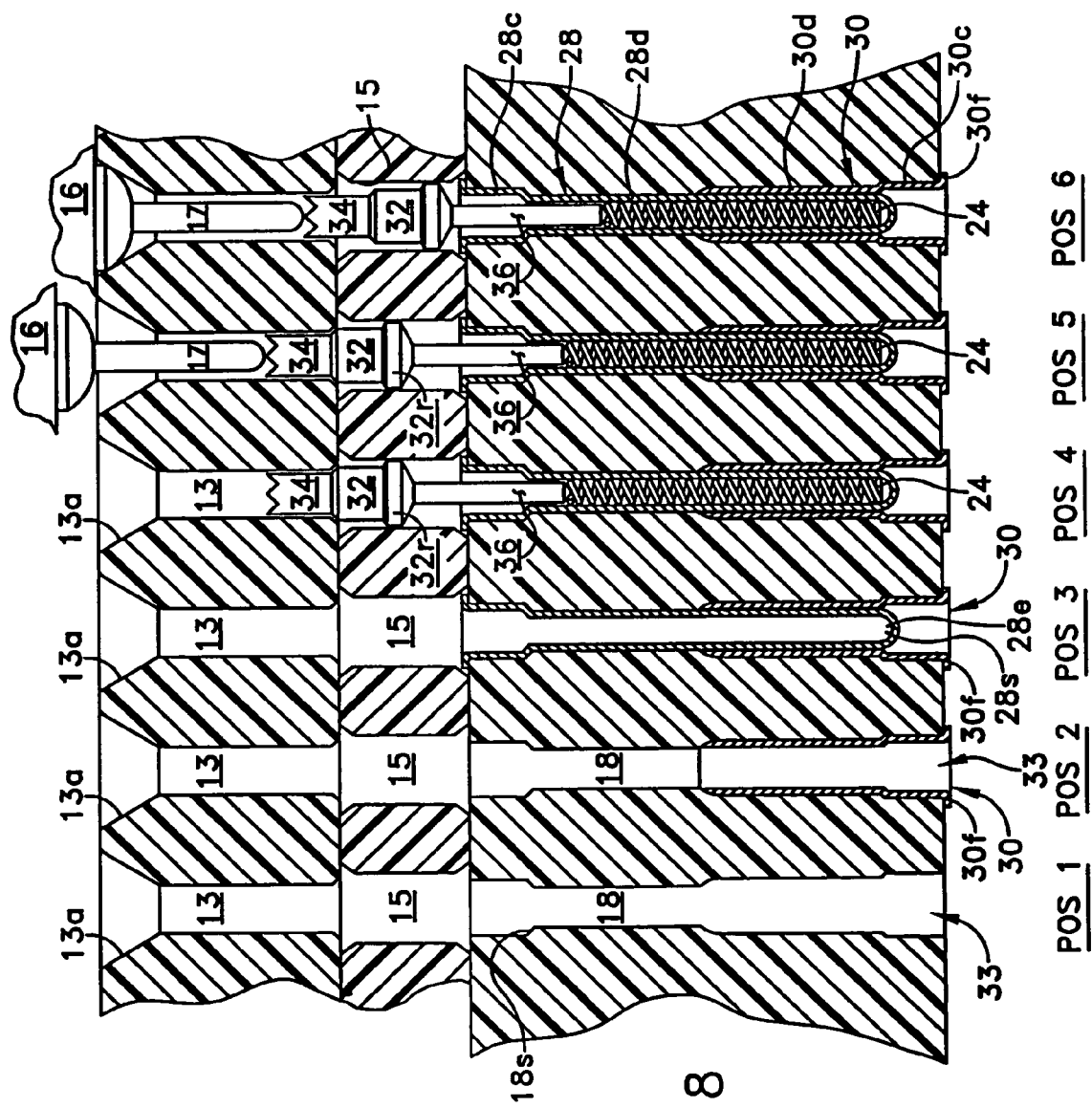
FIG. 8 is an enlarged broken away portion of the IC receiving socket and DUT board shown in FIG. 1, with several contact positions in various stages of assembly.

FIG. 8 shows various stages of assembly for apparatus 10. As shown in POS 1, lower sleeve members 30 may be pressed manually or automatically into lower ends 18b of respective vias 18 until flange 30f rests or is pressed against bottom surface 14b of DUT board 14. Lower sleeve member 30 forms an interference fit with via 18 of DUT board 14, and is thereby held firmly in place and provides good electrical engagement therewith, in part due to the plated material on the interior of the via. Similarly, upper sleeve members 28 may be pressed manually or automatically into corresponding upper ends 18a of vias 18, and also into lower sleeve members 30, until flange 28f pressed firmly against upper surface 14a of DUT board 14. Upper sleeve member 28 forms an interference fit with vias 18 of DUT board 14, and with lower sleeve member 30, and is thereby held firmly in place and provides good electrical engagement with both lower sleeve member 30 and with DUT board 14.

Thus, one aspect of the present disclosure is an apparatus that provides a relatively simple and quick method for replacement of malfunctioning elements of the conductive plunger assemblies, including the sleeve members, which can be removed manually from the DUT board. For example, when it is desired to replace conductive sleeve member 22, the sleeve or sleeve sections may be pushed out from the bottom side of via 18.

Lower plate 12l of test socket 12 then may be mounted on DUT board 14 such that bores 15 are in substantial alignment with vias 18. Biasing member 24 then may be inserted into sleeve member 22 until it rests against seat 22s. Plunger 26 may be inserted into bore 33 of sleeve 18 until lower end 36l of lower rod portion 36 rests against spring 24. It will be seen that bores 15 of lower plate 12b have a diameter selected to accommodate body 32 of plungers 26, such that ring portions 32r are closely and slidingly received therein. Thus, when assembled, lower portion 36 of plunger 26 extends at least partially into section 28d of sleeve member 22, where it is closely held therein, but is spaced apart from section 28c of sleeve member 22 due to the difference in the inner diameters of sections 28c,d.

Upper plate 12a then may be placed over lower plate 12b with bores 13 substantially aligned with corresponding bores 15 and vias 18. The diameter of bores 13 is selected to be slightly less than that of the outer diameter of body portion 32 of plunger 26, and slightly larger than that of upper rod section 34 of plunger 26. The difference in diameter of bores 13,15 causes plungers 26 to be depressed to an initial fixtured position extending a first selected force of, for example, 10 grams. The diameter of bores 13 is selected to slidingly receive respective terminal members 17 of package 16 as well as upper rod portion 34. Bores 13 may include an optional frusto-conical mouth portion 13a to facilitate guidance of terminal pins 17 into bores 13.

FIGS. 9-15, when taken together, illustrate another embodiment of an apparatus 10' including a test socket 12 mounted on a DUT board 14 in a conventional manner, and an alternate contact plunger assembly 20'. DUT board 14 is substantially similar to the DUT board of the previous embodiment, and will not be described again in the same detail.

Figure 9:
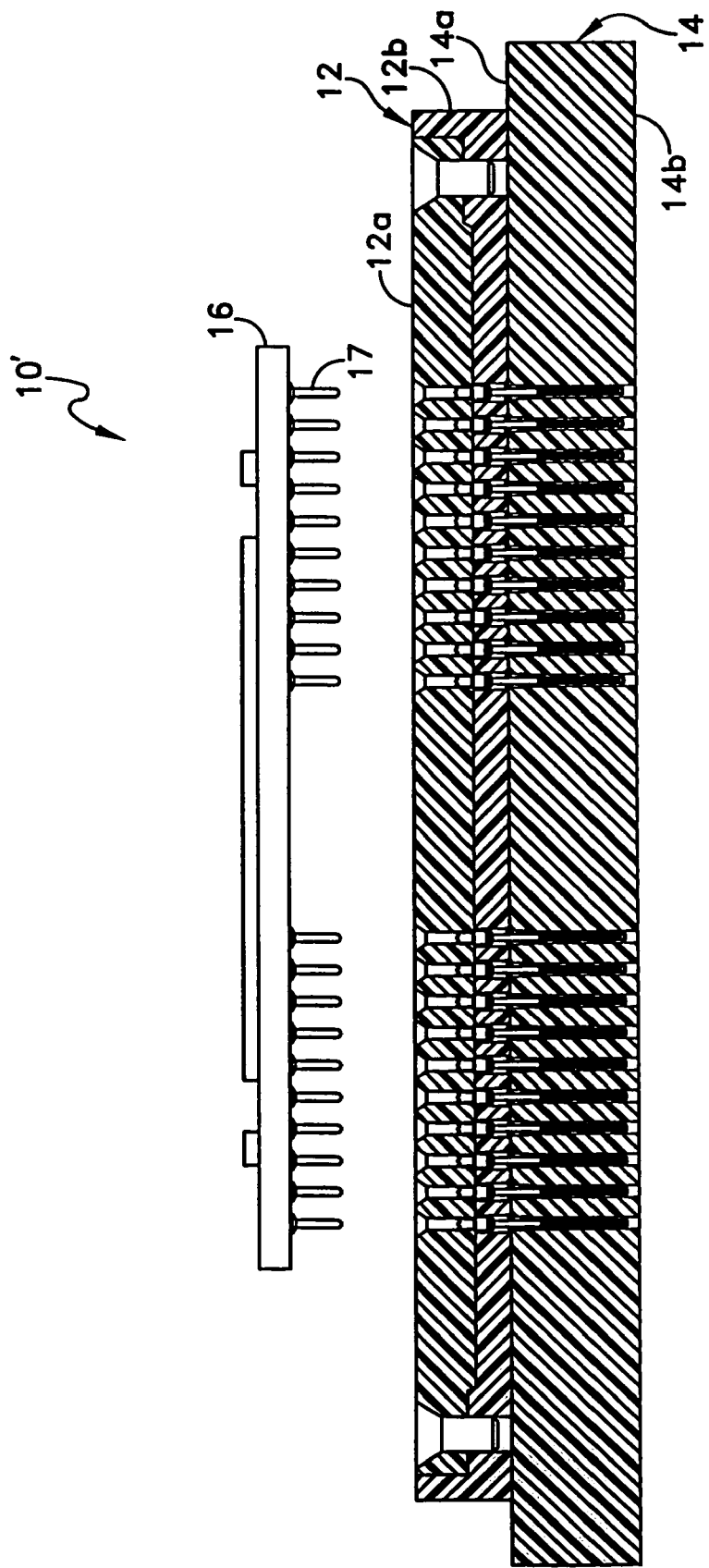
FIG. 9 is a cross sectional view of another embodiment of an IC receiving socket and DUT board according to the present embodiment, shown with a PGA IC package spaced slightly above the socket.
Figure 10:
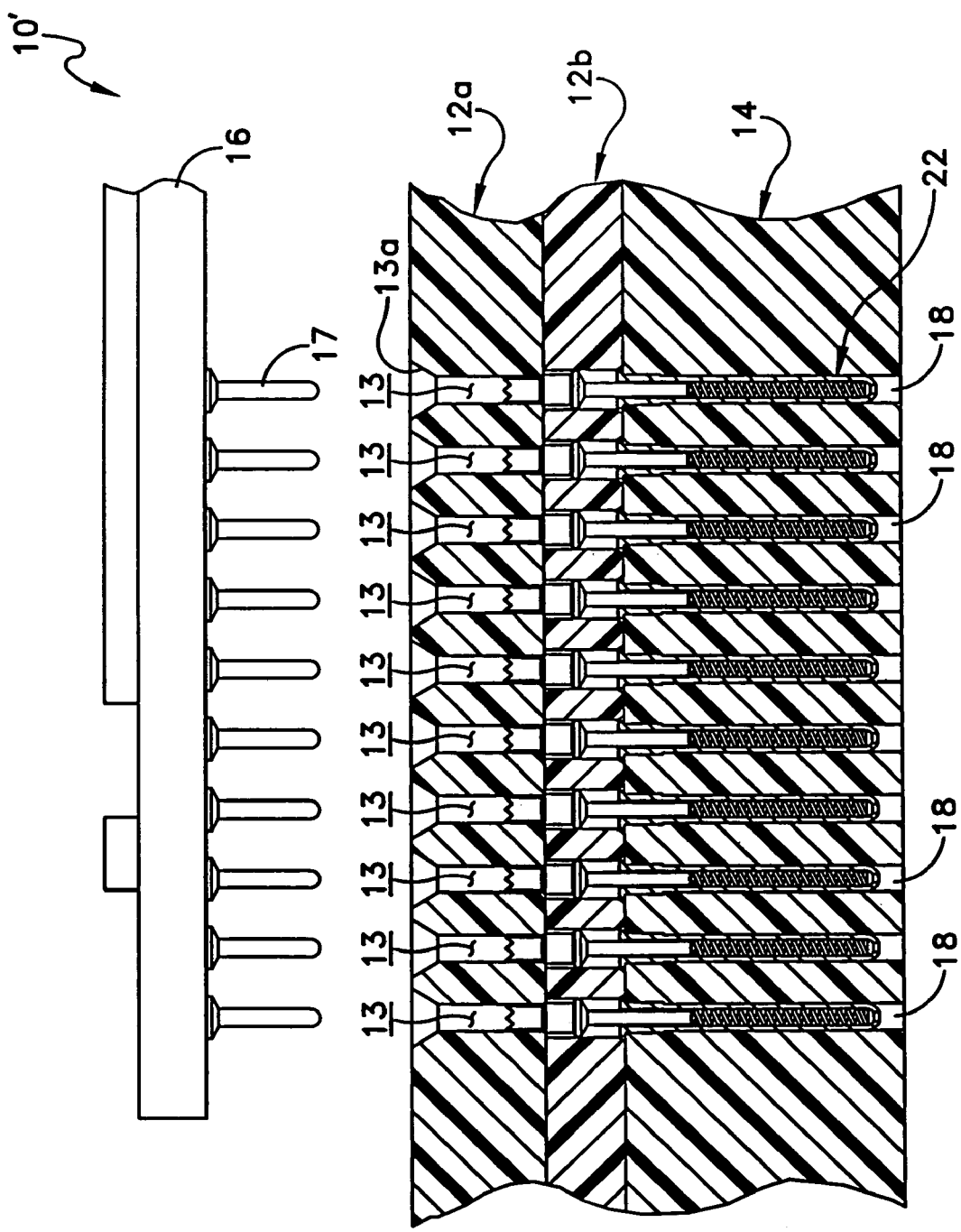
FIG. 10 is an enlarged cross sectional view of the IC receiving socket and DUT board shown in FIG. 9.
Figure 11:
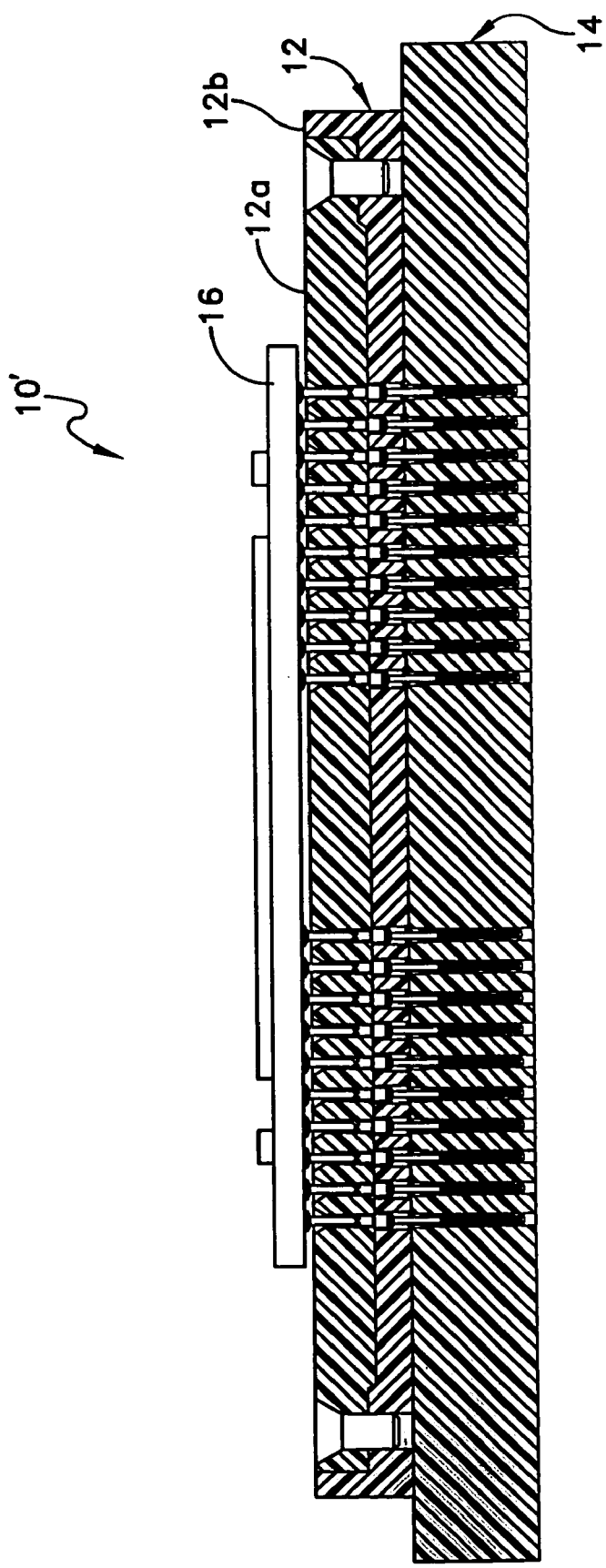
FIG. 11 is a cross sectional view of the IC receiving socket and DUT board shown in FIGS. 9-10, shown with the IC package in a fully mounted position.
Figure 12:
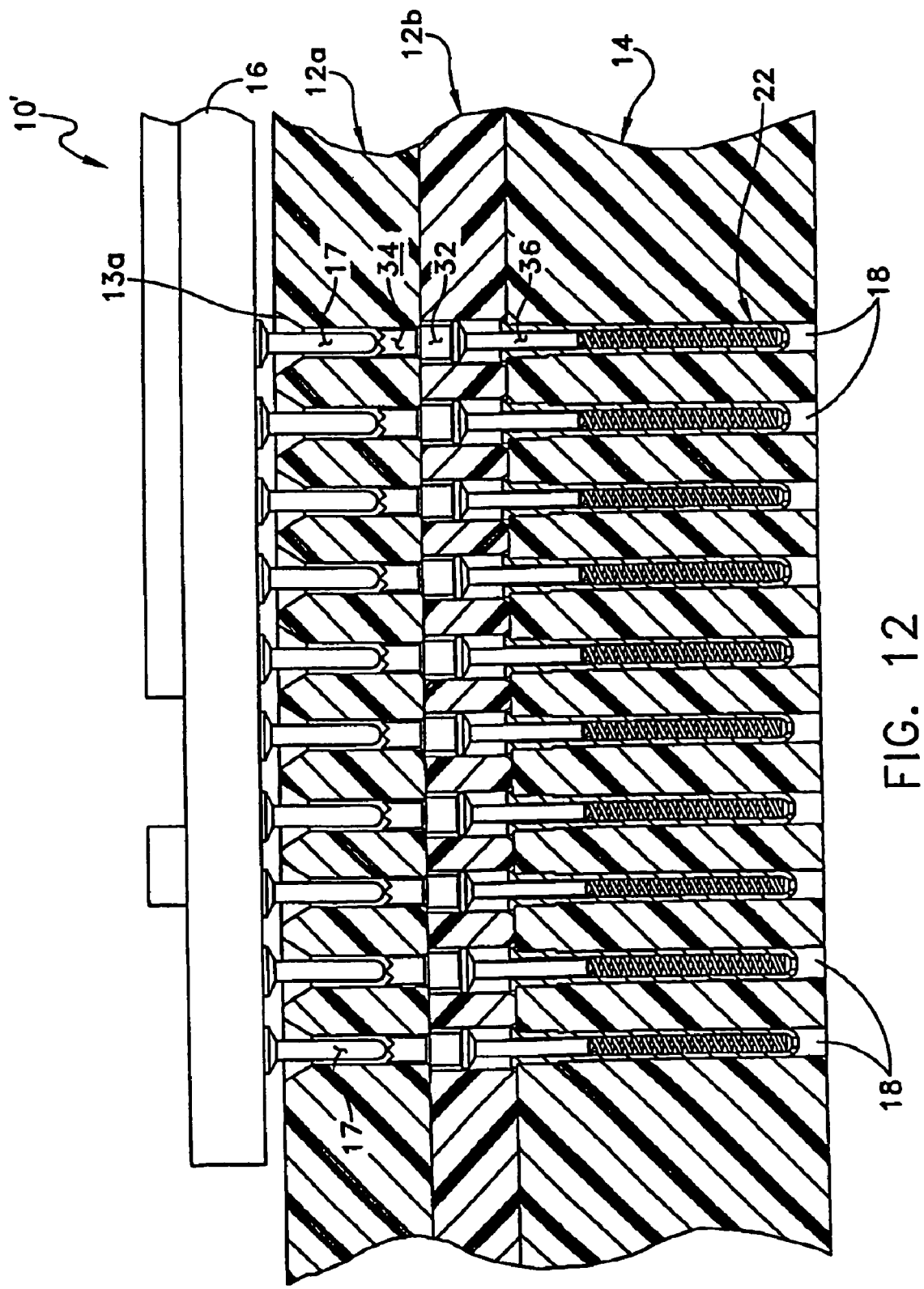
FIG. 12 is an enlarged cross sectional view of the IC receiving socket and DUT board shown in FIG. 11.

FIGS. 9-10 show a PGA package 16 carrying a DUT (not illustrated) spaced apart from test socket 12, prior to being mounted in an operating position. In FIGS. 11-12, PGA package 16 is shown being mounted in an operating position with terminal pins 17 contacting contacts 38 of plungers 26, which are thereby depressed and provide a contact force of, for example, 21 grams.

As in the previous embodiment, each via 18 of DUT board 14 has an inner diameter $d_1$ at each end 18a,b that is greater than inner diameter $d_2$, but the difference between d1 and d2 is less than in the previous embodiment, resulting in a shoulder 18s is not as pronounced as in the previous embodiment.

FIGS. 13-14 show alternate contact plunger assembly 20' in greater detail, including a sleeve member 22, a biasing member 24, and a plunger 26. Biasing member 24 and plunger 26 are substantially the same as in the previous embodiment, and will not be described again. In the present embodiment, sleeve member 22 does not include two sections. Thus, sleeve member 22 has upper and lower ends 22u,l, and a minor axial length portion 22c at upper end 22u having a first diameter $d_7$ selected to form an interference fit with vias 18 of DUT board 14. Sleeve 22 also has a second major axial length portion 22d having a second diameter $d_8$ that is less than diameter $d_7$. Upper end 22u of sleeve member 22 is open, and lower end 22l of sleeve member 22 is constricted or closed, thereby forming an internal spring seat 22s. Upper end 22u of sleeve member 22 includes an outwardly radially extending flange 22f. Flange 22f may be formed integrally with sleeve member 22 or may be a separate part received on top and bottom surfaces 14a,b of DUT board 14 and electrically connected to sleeve member 22. Preferably, sleeve member 22 may be formed of a suitable electrically conductive material such as a copper alloy and is preferably plated with gold.

Figure 15:
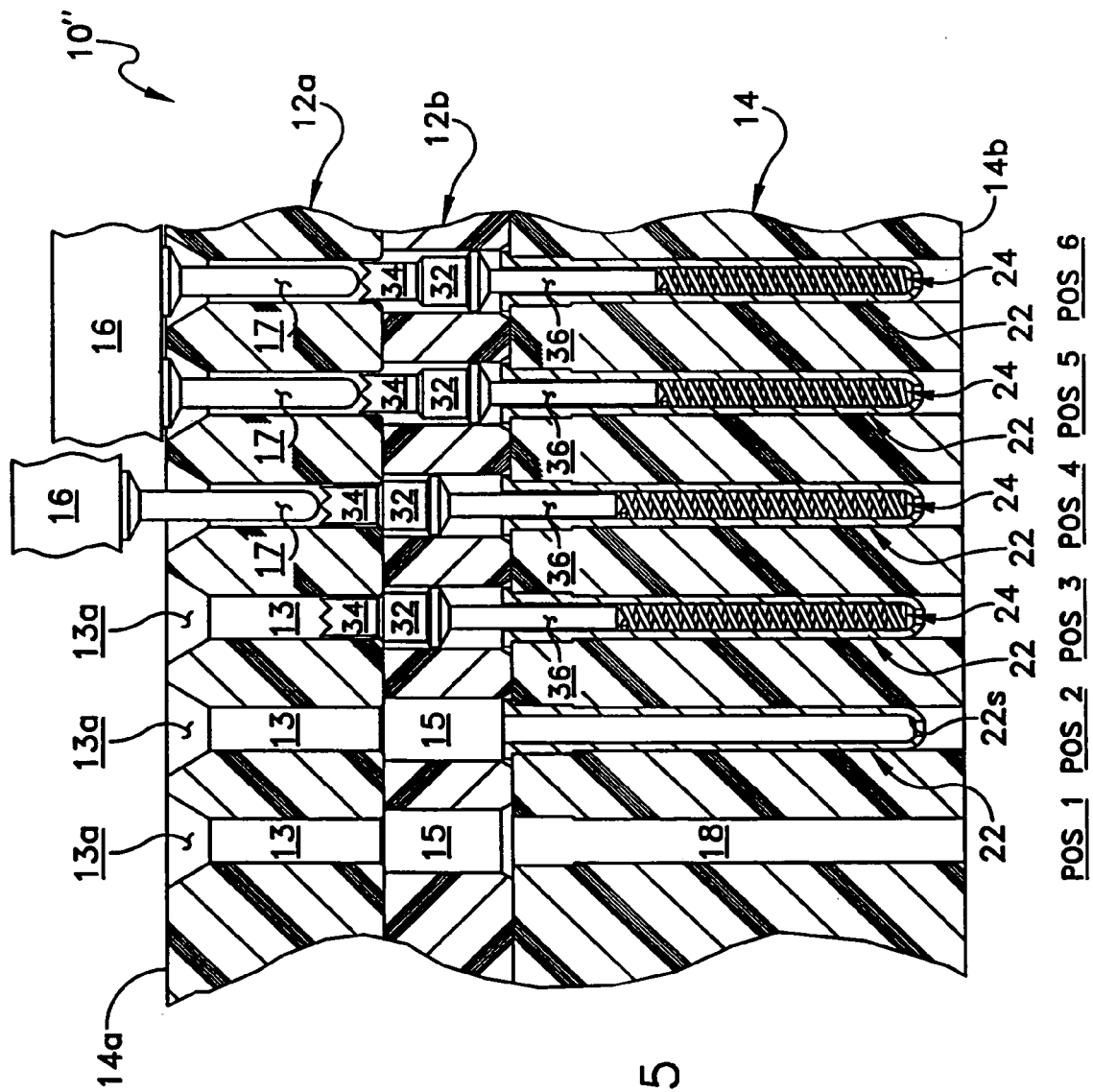
FIG. 15 is an enlarged broken away portion of the IC receiving socket and DUT board shown in FIG. 9, with several contact positions in various stages of assembly.

With reference now to FIG. 15, apparatus 10' may be assembled by pressing sleeve members 22 into respective vias 18 until flange 22f rests against upper surface 14a of DUT board 14. Sleeve member 22 forms an interference fit with vias 18 of DUT board 14, and is held firmly in place therein and provides good electrical engagement with DUT board 14.

In position POS 1, bores 13,15 and vias 18 are shown in upper plate 12a, lower plate 12b, and DUT board 14, respectively, without further structure.

POS 2 shows a sleeve member 22 press fitted into place in via 18, with flange 22f seated or resting against upper surface 14a of DUT board 14.

POS 3 shows biasing member 24 positioned in sleeve member 22 with body 32 of plunger 26 positioned in bore 15 of lower plate 12b and lower rod portion 36 positioned in bore 33. In this manner, upper plate 12a limits the upward movement of plunger 26 to the initial fixtured position.

POS 4 shows plunger 26 is the same position as POS 3, with a terminal pin 17 of PGA package 26 positioned above contact point 38, prior to operation.

POS 5 and POS 6 both show plunger 26 in an operating position in electrical engagement with a terminal pin 17 of PGA package 16, broken away.

FIGS. 16-24, when taken together, illustrate yet another embodiment of an apparatus 10''' including an alternate test socket 11 mounted on a DUT board 14 in a conventional manner, and yet another an alternate contact plunger assembly 20'' in which the biasing members 24 are external to the DUT board.

Figure 16:
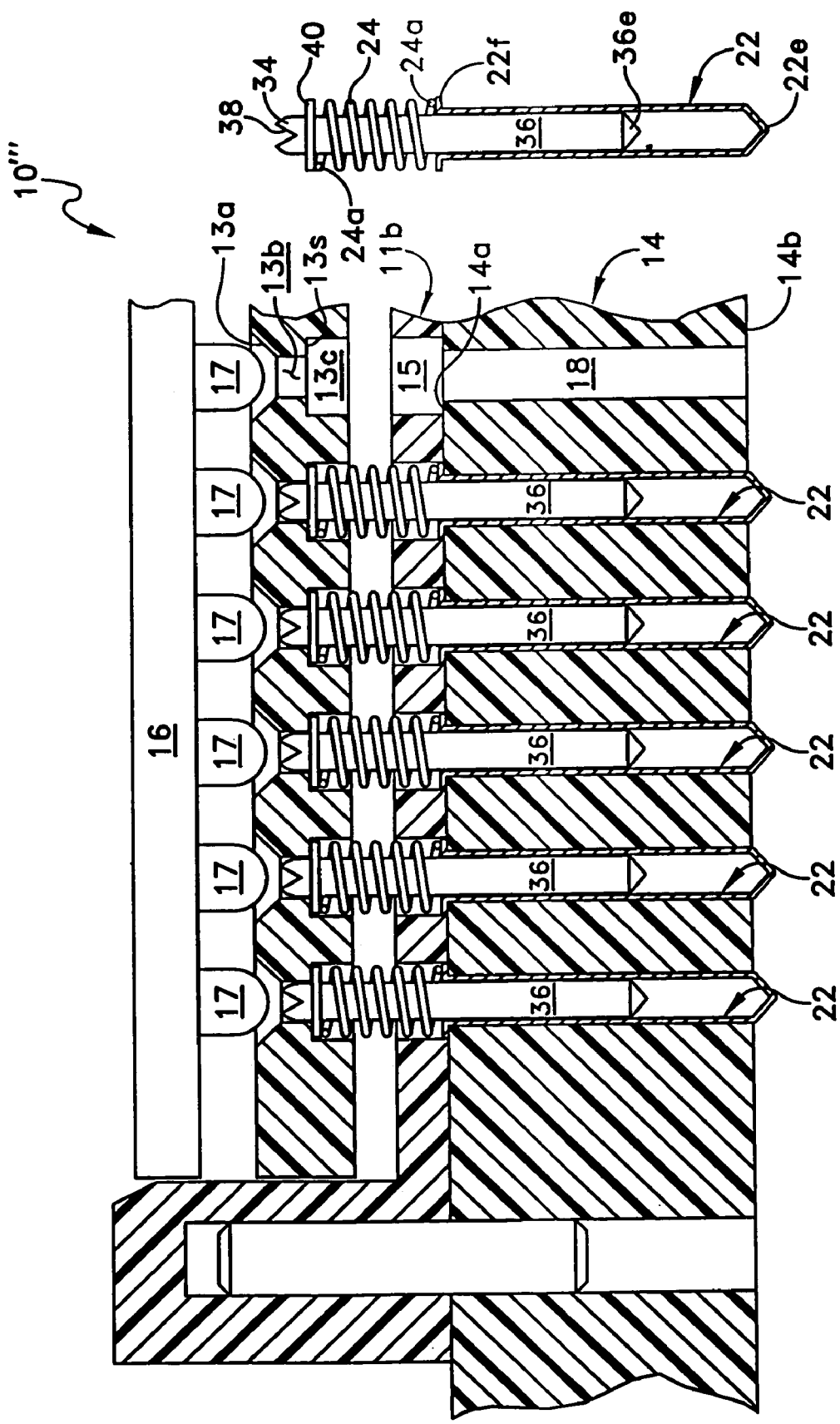
FIG. 16 is an enlarged broken away cross sectional view of a portion of an alternate embodiment of an IC receiving socket and contact plunger assembly made in accordance with the present disclosure, showing a BGA IC package spaced slightly above the socket.

As shown in FIG. 16, a socket 11 mounted on DUT board 14 an upper and lower plates 11a,b. Upper plate 11a includes bores 13 extending therethrough, each of which has an upper small diameter portion 13b and lower larger diameter portion 13c forming a shelf 13s therebetween. Bores 13 may be adapted to receive solder balls 17 of a BGA IC package 16 for testing, and may optionally include frusto-conical portion 13a. Lower plate 11b includes bores 15 extending therethrough and having a diameter substantially the same as lower larger diameter portion 13c of upper plate 12a. It will be understood that BGA package 10''' is shown merely as illustrative and that the disclosure can be used with various types of electronic packages such as, for example, LGA packages.

As shown, when in an assembled configuration, bores 13 and 15 are preferably aligned with vias 18 of DUT board 14, in which electrically conductive sleeve members 22 are preferably received. Sleeve members 22 preferably have a closed lower end 22l extending outwardly from lower end 14b of DUT board 14, and a flange 22f at the upper end 22u of sleeve member 22. Flange 22f may be integrally formed with sleeve member 22 or, if desired, may be a separate part received on top surface 14a of DUT board 14 and may be electrically connected to sleeve member 22. As stated above, vias 18 are generally plated with electrically conductive material and sleeve members 22 are closely received therein in electrically conductive relationship with the plating material.

Still referring to FIG. 16, plunger 26' has a generally longitudinal cylindrical shape and includes a first and second rod portions 34, 36, and an outwardly radially extending flange 40 positioned between the first and second rod portions 34,36. First and second rod portions 34,36 extend from opposite ends of flange 40 along a longitudinal axis "A." In the present embodiment, the outer diameter of rod portions 34, 36 is substantially the same. First rod portion 34 includes a selected contact configuration 38 at an upper end thereof, which is a four point crown in the present embodiment. It should be understood that any contact configuration may be used. Second rod portion 36 depends downwardly from flange 40 and is sized to be closely and slidingly received in bore 33 of sleeve member 22. Lower end 36a of rod 36 may be pointed, as in the present embodiment, and is preferably spaced apart from lower end 22l of sleeve member 22, and from lower end 14b of DUT board 14. Flange 40 has an outer diameter selected to freely fit in larger diameter bore portion 13c of plate 12a but larger than small diameter bore portion 13b, thereby limiting travel of flange 40 by engagement with shelf 13s. Shelf 13s also provides a flat wall spring seat for biasing member 24 which is received between flange 40 and flange 22f of sleeve member 22. Flange 22f forms an opposing flat wall, for a purpose to be described below. Second rod portion 36 is closely and slidably received in each sleeve member 22.

In assembling the apparatus, sleeve members 22 are placed in vias 18 of DUT board 14, and bottom plate 12b of test socket 12 is positioned such that bores 15 are substantially aligned with vias 18. Plungers 26 are assembled with biasing members 24 encircling second rod portions 36, and then both are dropped into bores 33 of sleeve members 22. Top plate 12a of socket 12 is then positioned such that bores 13 are substantially aligned with bores 15, and such that plungers 26 are retained in position by pushing on flanges 40 against the bias of biasing members 24.

In use, terminals 17 of package 16 engage contact portions 38 and depress plungers 26 against the force of biasing members 24 when package 16 is loaded in socket 12 in a conventional manner.

To repair or replace an individual contact in apparatus 10''', top plate 12a may be removed to expose contact plunger assembly 20''. Each contact plunger assembly 20'' to be repaired or replaced is then lifted individually out of the respective sleeve member for repair or replacement.

FIGS. 17-24 show various alternative embodiments of contact plunger assembly 20'' that may be used in any of the foregoing embodiments, with minor changes, for example, to the vias 18 and/or test sockets 12.

Figure 17:
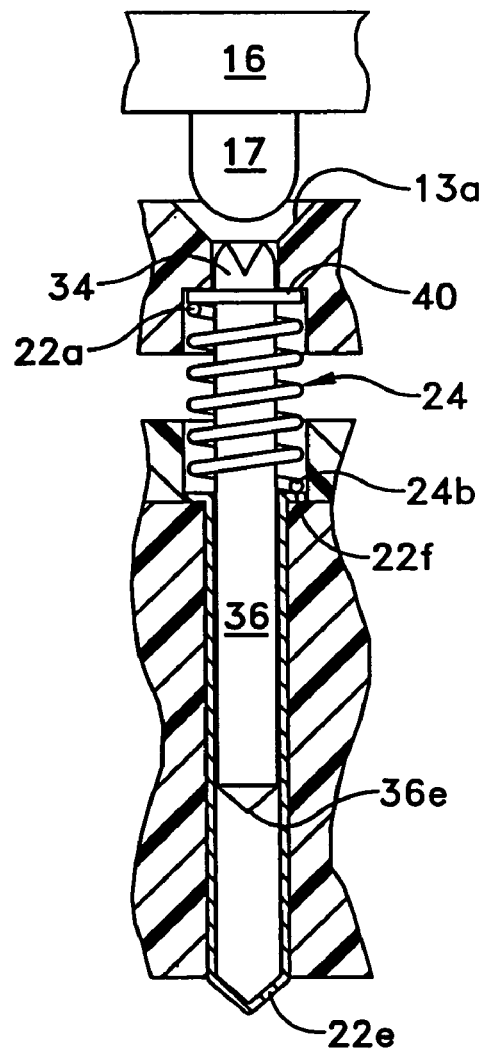
FIGS. 17-24 are cross sectional views of alternate embodiments of test apparatus in accordance with the present disclosure, in which a biasing member is external to the DUT board.

FIG. 17 shows a contact plunger assembly 41 having a substantially similar structure as contact plunger assembly 20''. Contact plunger assembly 41 has the additional feature that spring 24 is provided with n plus one-half turns so that the spring ends 24a,b are disposed on diametrically opposite sides of lower rod 36 to exert a rotational force on plunger 26 to bias the distal free end of lower rod 36 against sleeve member 22. This facilitates or improves electrical engagement with sleeve member 22 when spring 24 pushes asymmetrically on the flat surfaces of flanges 22f, 40, which preferably lie in planes generally perpendicular to the longitudinal axis of plungers 26 and sleeve members 22.

Figure 18:
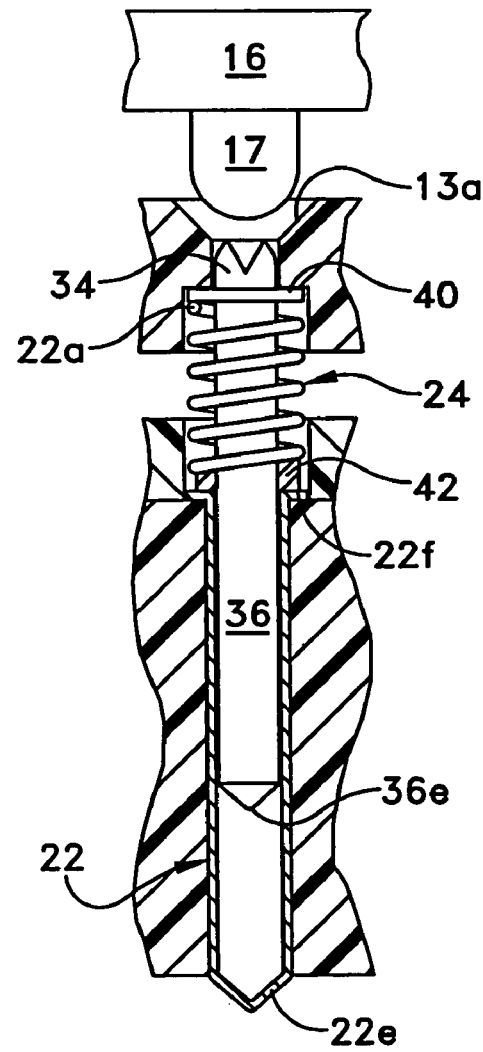

FIG. 18 shows a contact plunger assembly 43 again having a substantially similar structure as contact plunger assembly 20'''. Contact plunger assembly 41 has the additional feature that asymmetrical aspect of spring 24 engagement is provided or increased by wedge shaped insert 42 formed with an angled biasing top surface (not illustrated).

Figure 19:
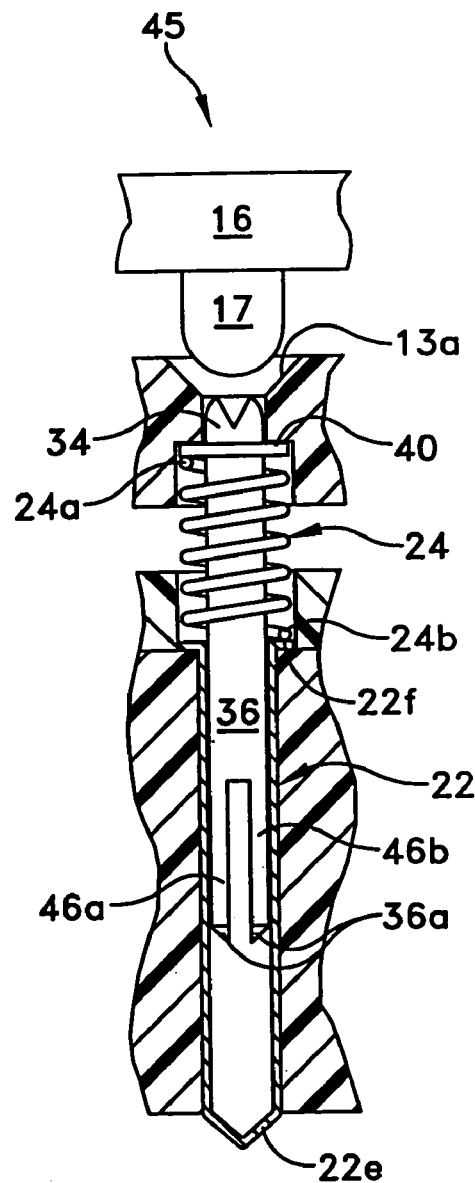

FIG. 19 shows a contact plunger assembly 45 having a substantially similar structure as contact plunger assembly 41, and additionally including a longitudinal slot 44 defining two arms 46a,b in lower rod 36 of plunger 26. Arms 46a,b are preferably bent apart slightly to provide a radial outward spring force forming an interference fit with sleeve member 22. Thus, arms 46a,b provide further improvement in electrical engagement force with sleeve member 22 when added to or when replacing the rotational bias provided by the diametrically positioned spring ends 24a,b. Examples of contact probes that are include slotted plungers are shown in commonly-owned U.S. Pat. No. 6,159,056, the subject matter of which is incorporated herein by this reference.

Figure 20:
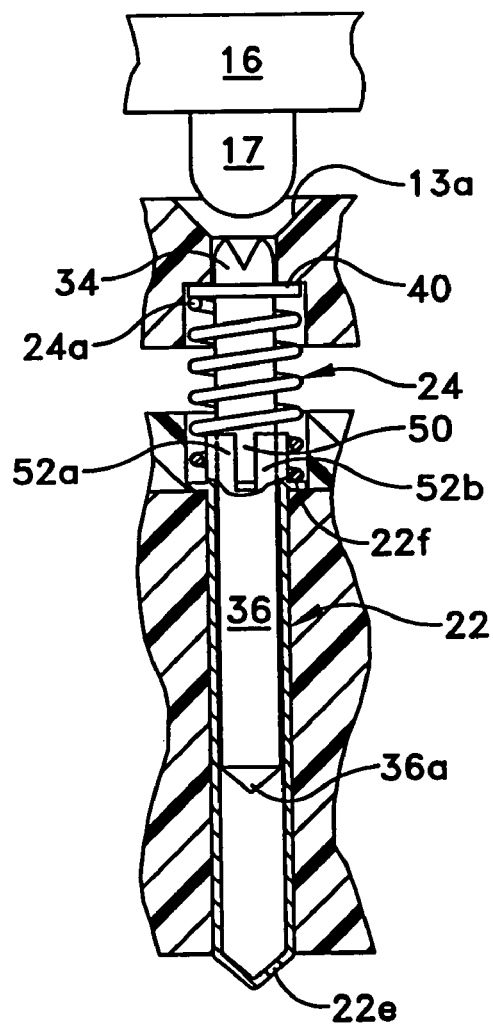

FIG. 20 shows a contact plunger assembly 47 having a substantially similar structure as contact plunger assembly 41. In the present embodiment, sleeve member 22 further includes an extension 48 at its upper end 22u which is formed with a longitudinally extending slot 50 defining two arms 52a,b. Arms 52a,b are preferably bent slightly inwardly to provide a spring force, thereby forming an interference fit with sleeve member 22 for providing good electrical engagement force with lower rod 36.

Figure 21:
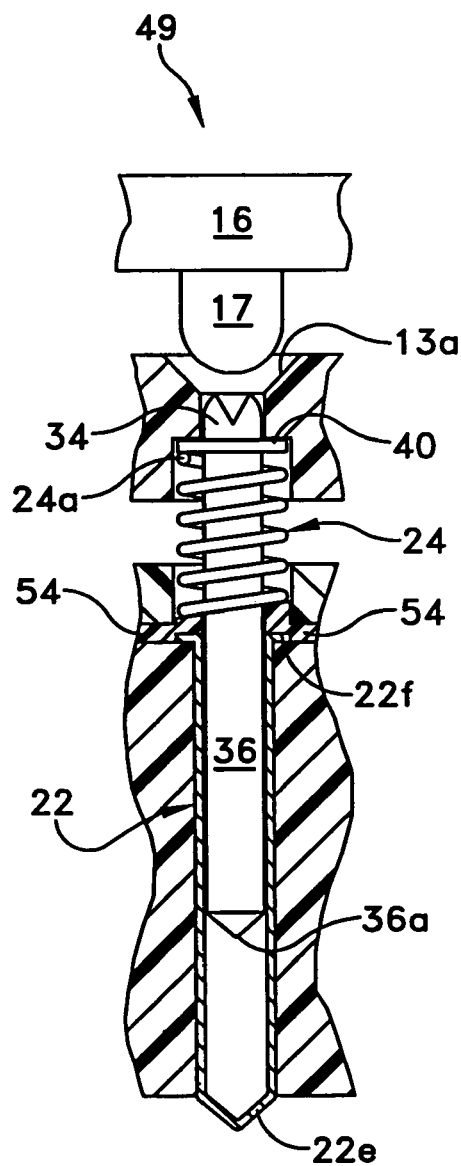

FIG. 21 shows a contact plunger assembly 49 having a substantially similar structure as contact plunger assembly 41, including asymmetrical spring ends 24a,b. In the present embodiment, socket 11 is modified to include an underlying plate 54 having a wedge shaped or bias angled top surface (not illustrated) disposed within respective lower diameter bore portions 15 of bottom plate 11b, to provide an increased asymmetrical force on the plunger rod portion against the sleeve member.

Figure 22:
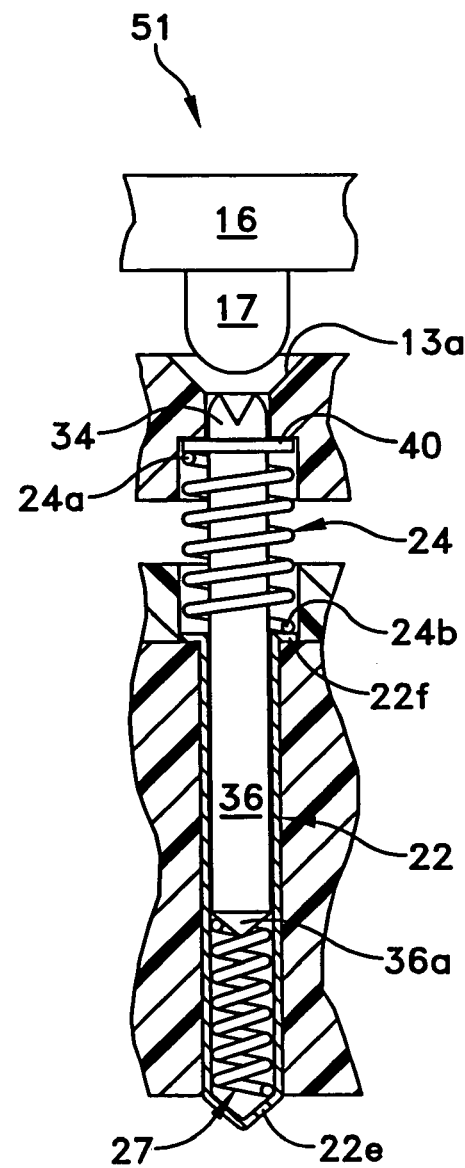

FIG. 22 shows a contact plunger assembly 51 having a substantially similar structure as contact plunger assembly 41, including asymmetrical spring ends 24a,b. Contact plunger assembly 51 further includes an additional biasing member 27 positioned in sleeve member 22 between lower end 36a of lower rod 36 and closed end 22l of sleeve member 22. The additional spring 27 provides additional contact force for engagement with solder balls 17 of package 16.

Figure 23:
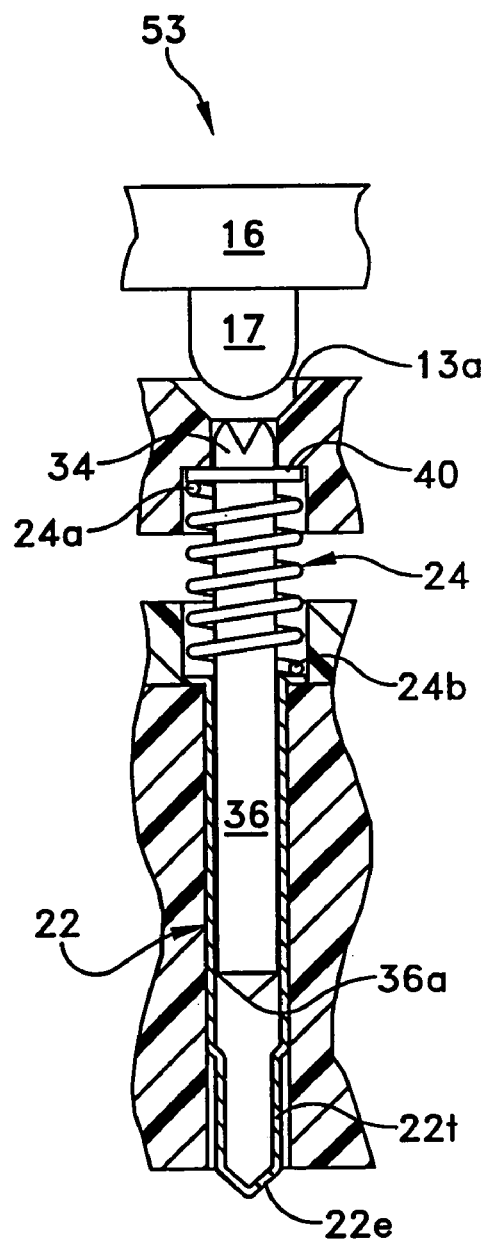

FIG. 23 shows a contact plunger assembly 53 having a substantially similar structure as contact plunger assembly 41, including asymmetrical spring ends 24a,b. Sleeve member 22 of contact plunger assembly 53 includes a reduced diameter tapered portion 22t at the lower, closed end 22l, which facilitates assembly and soldering.

Figure 24:
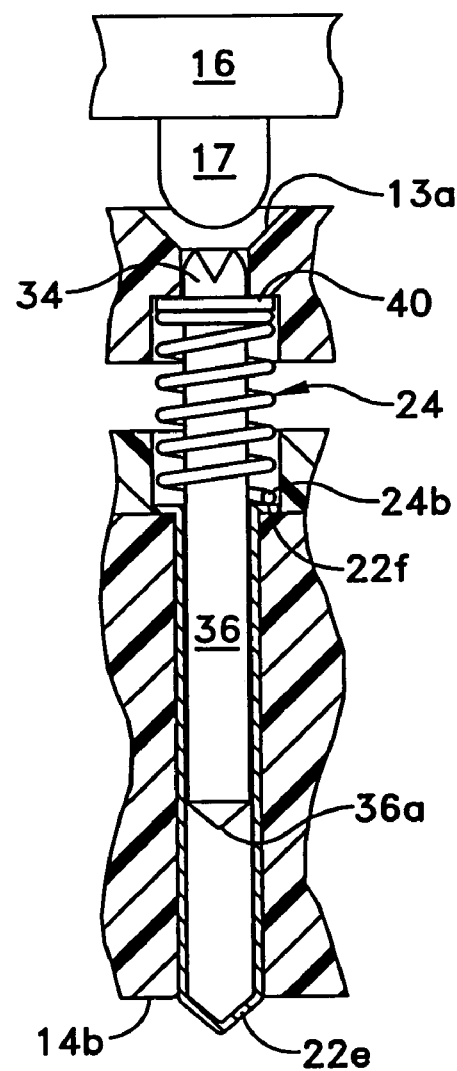

FIG. 24 shows a contact plunger assembly 55 having a substantially similar structure as contact plunger assembly 41, in which the asymmetrical position of spring ends 24a,b provides an asymmetrical force on lower rod 36. In the present embodiment, spring end 24a of spring 24 is flattened so that the first turn engages the seating surface essentially 360 degrees in the at rest position of the spring, whereas the opposite end 24b of the spring is merely cut so that only the distal free end of the spring engages the seating surface in the at rest position. Such an arrangement provides the desired rotational force without regard to the relative angular positions of the two distal free ends of the spring.

FIGS. 25-29 shows further alternate DUT board configurations and contact plunger assemblies that may be used in any of the foregoing embodiments, with minor changes to the vias 18 and/or test sockets 12.

FIG. 25 shows a contact plunger assembly 60 that includes a first sleeve member 23 and a second sleeve member 22. Sleeve member 23 has a first open end 23a formed with a radially, outwardly extending flange 23f similar to flange 22f of sleeve member 22. Sleeve member 23 also has a second opposite end 23, which is also open and is shown extending beyond the lower surface 14b of circuit board 14. If desired, the sleeve member 23 may have the same length as sleeve member 22. Sleeve member 23 also includes an intermediate axial length section 25 formed with an enlarged diameter portion 25a, shown in frusto-conical shape, which forms or enhances an interference fit with via 18. Sleeve member 22 has an open end (not illustrated) formed with a radially, outwardly extending flange 22f which is arranged to butt up against flange 23f of sleeve member 23. Sleeve member 22 has a closed second end 22l which serves as a spring seat 22s for biasing member 24, as well as prevents the entry of contaminants.

A plunger 24 includes a body portion 32 with an radial flange 32r extending outwardly from body 32. Plunger 24 also includes an upper rod portion 34 extending upwardly from body 34 adjacent flange 32r, and a lower rod portion 36 depending downwardly from body 32. Plunger 24 may have any suitable contact configuration 38, which is a rounded point in the present embodiment.

To assemble, sleeve member 23 is first pushed into via 18 to form an interference fit. Sleeve member 22 is then inserted into the bore of sleeve member 23 until flange 22f rests against flange 23f of sleeve member 23. Thereafter, biasing member 24 is inserted into the bore (not illustrated) of sleeve member 22, followed by plunger 26, until lower rod 36 rests against biasing member 24.

FIG. 26 shows a contact assembly 70 having the same first and second sleeve members as contact assembly 60, but differs therefrom by the diameter and position of biasing member 24. Biasing externally of DUT board 14 between flange 22f and flange 32r. It will also be noted that the bottom turn of biasing member 24 which in the present embodiment is a coil spring, lies in a plane which is essentially normal to the longitudinal axis of plunger 24, whereas the top turn forms a non-ninety degree angle, which places a rotational force on plunger 24 relative to the longitudinal axis to enhance electrical contact between plunger rod 36 and sleeve member 22.

To assemble, sleeve member 23 is first pushed into via 18 to form an interference fit. Sleeve member 22 is then inserted into the bore of sleeve member 23 until flange 22f rests against flange 23f of sleeve member 23. Thereafter, biasing member 34 is slidably received onto lower rod 24 of plunger 26, and thereafter lower rod 24 is inserted into the bore (not illustrated) of sleeve member 22 until the bottom coil rests against flange 22f and the upper coil rests against flange 32r.

FIG. 27 shows a contact assembly 80 having only a single sleeve member 23 fitted into via 18. Plunger 26 has substantially the same structure as plunger 24 shown in FIG. 25-26, except that lower rod 36 may have a larger diameter so that it closely and slidingly fits within the bore of a sleeve member 23. A ball 82, such as a solder ball, is positioned at lower end 23l of sleeve member 23 to exclude contaminants and the like.

FIG. 28 shows a contact assembly 90 having a substantially similar structure as contact assembly 80, except that it does not include solder ball 82, leaving lower end 23l of sleeve member 23, open.

FIG. 29 shows a contact assembly 100 having a substantially similar structure as contact assembly 90, except that sleeve member 23 has a closed lower end 23l, and an enlarged diameter portion 25a configured as radiused or bulged section, which provides an improved interference fit. It will be understood that sleeve members 23 could have an open lower end 23l, if desired.

The operation of the contact assemblies shown in FIGS. 25-29 is similar to that of the previously described embodiments.

While this disclosure has been particularly shown and described with references to preferred embodiments thereof, it will be understood by those skilled in the art that various changes in form and details may be made therein without departing from the spirit and scope of the disclosure as defined by the appended claims.

What is claimed is:

1. An apparatus for interfacing electronic packages and test equipment for the packages, comprising:

a printed circuit board having first and second opposing surfaces, a plurality of vias formed in the printed circuit board and forming a predetermined pattern on the first surface, each via having upper and lower ends and an inner diameter;

a test socket overlaying and being connected to the first surface of the printed circuit board, the test socket including a first plate overlaying a second plate, each of the first and second plates including a plurality of bores corresponding to the vias in the printed circuit board;

a conductive sleeve member positioned in each via, the sleeve member having an open upper and a closed lower end;

a plunger comprising an annular flange extending outwardly from a rod, the flange dividing the rod into a first rod portion extending upwardly from the annular flange and a second rod portion depending downwardly from the annular flange, the first rod portion including an upper surface defining a selected contact region; and a biasing member positioned about the second rod portion and being seated against the first surface of the printed circuit board and the lower surface of the annular flange;

wherein, when the apparatus is in an operating position, the first rod portion is at least partially received in a bore of the first plate, the annular flange is received in a bore of the second plate, and the second rod portion is at least partially received in the conductive sleeve member, and the plunger is urged upwardly to make electrical contact with a package terminal.

2. The apparatus of claim 1, wherein the bores of the second plate include a shoulder defining a smaller diameter bore portion, and wherein the upward movement of the plunger is restricted by the shoulder when the apparatus is in an operating position.

3. The apparatus of claim 2, wherein the annular flange has an outer diameter that is greater than an inner diameter of the plurality of bores of the second plate, such that when the biasing member is biased, the upward movement of the plunger is restricted by the annular flange resting against the shoulder.

4. The apparatus of claim 1, wherein the biasing member is seated against the lower end of the conductive sleeve member.

5. The apparatus of claim 1, wherein the lower end of the conductive sleeve member is spaced apart from the second surface of the printed circuit board.

6. The apparatus of claim 1, wherein the conductive sleeve member extends from the second surface of the printed circuit board.

7. The apparatus of claim 1, wherein the conductive sleeve member further comprises a radially extending flange at the upper end thereof.

8. The apparatus of claim 7, wherein the conductive sleeve member and the radially extending flange are unitary.

9. The apparatus of claim 7, wherein the printed circuit board includes an annular recess constructed and arranged to receive the radially extending annular flange of the conductive sleeve member therein.

10. The apparatus of claim 9, wherein when the radially extending flange is received in the annular recess such that an upper surface of the radially extending flange is coplanar with the first surface of the printed circuit board.

11. The apparatus of claim 1, wherein an outer diameter of the conductive sleeve member is less than an inner diameter of a via on the printed circuit board, and the conductive sleeve member is frictionally received in the via.

12. The apparatus of claim 1, wherein the conductive sleeve member is removably positioned in one of the plurality of vias in the printed circuit board.

13. The apparatus of claim 1, wherein the biasing member is removably positioned in one of the plurality of vias above the first surface of the printed circuit board.

14. The apparatus of claim 1, wherein the conductive sleeve member has an exterior surface, and the exterior surface is plated.

15. The apparatus of claim 1, wherein the biasing member is a coiled spring.

16. The apparatus of claim 1, wherein the conductive sleeve member includes an enlarged diameter portion constructed and arranged to form an interference fit with one of the plurality of vias.

17. The apparatus of claim 1, wherein the conductive sleeve member comprises an inner sleeve member section and an outer sleeve member section, the inner and outer sleeve members being constructed and arranged to form an interference fit when at least a portion of the inner sleeve member is received in at least a portion of the outer sleeve member.

* * * * *